(12) United States Patent
Connell et al.

(10) Patent No.: US 10,404,212 B1
(45) Date of Patent: Sep. 3, 2019

(54) PROGRAMMABLE DRIVER FOR FREQUENCY MIXER

(71) Applicant: Futurewei Technologies, Inc., Plano, TX (US)

(72) Inventors: Lawrence E. Connell, Naperville, IL (US); Kent Jaeger, Cary, IL (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/056,175

(22) Filed: Aug. 6, 2018

(51) Int. Cl.
| | | |
|---|---|---|
| *H04B 1/30* | (2006.01) | |
| *H03D 7/14* | (2006.01) | |
| *H03D 7/16* | (2006.01) | |
| *H03F 1/32* | (2006.01) | |
| *H03F 1/30* | (2006.01) | |

(52) U.S. Cl.
CPC ........... *H03D 7/1483* (2013.01); *H03D 7/145* (2013.01); *H03D 7/1433* (2013.01); *H03D 7/1441* (2013.01); *H03D 7/166* (2013.01); *H03F 1/30* (2013.01); *H03F 1/32* (2013.01); *H04B 1/30* (2013.01)

(58) Field of Classification Search
CPC .................................. H04B 1/30; H04B 1/40
See application file for complete search history.

(56) References Cited

U.S. PATENT DOCUMENTS

| | | | | |
|---|---|---|---|---|
| 5,749,051 | A | | 5/1998 | Dent |
| 6,101,373 | A | * | 8/2000 | Samuels ............. H03G 3/3068 330/133 |
| 6,785,530 | B2 | | 8/2004 | Hatcher et al. |
| 6,798,845 | B1 | * | 9/2004 | Nakajima ................ H04B 1/04 375/285 |
| 6,992,519 | B2 | | 1/2006 | Vilander et al. |
| 7,027,793 | B2 | * | 4/2006 | Gard ........................ H04B 1/30 375/285 |
| 7,302,248 | B2 | | 11/2007 | Craninckx |
| 7,554,380 | B2 | | 6/2009 | Embabi et al. |
| 7,639,998 | B1 | * | 12/2009 | Halvorson ............ H03F 1/0272 455/234.2 |
| 8,526,904 | B2 | * | 9/2013 | Gard ........................ H04B 1/30 455/127.2 |

(Continued)

OTHER PUBLICATIONS

Yamaji, Takafumi, et al., "An I/Q Active Balanced Harmonic Mixer with IM2 Cancelers and a 45 degree Phase Shifter," IEEE Journal of Solid-State Circuits, vol. 22, No. 12, Dec. 1998, 7 pages.

*Primary Examiner* — Blane J Jackson
(74) *Attorney, Agent, or Firm* — Vierra Magen Marcus LLP

(57) ABSTRACT

The disclosure relates to technology for shifting a frequency range of a signal. In one aspect, a circuit comprises a frequency mixer, a frequency synthesizer configured to generate an oscillator signal, a programmable driver, and a controller. The programmable driver is configured to receive the oscillator signal from the frequency synthesizer and to provide the oscillator signal to the oscillator input of the frequency mixer. The programmable driver is configured to have a variable drive strength. The controller is configured to control the drive strength of the programmable driver based on a frequency of the oscillator signal to adjust a rise time and a fall time of the oscillator signal at the oscillator input of the frequency mixer.

20 Claims, 13 Drawing Sheets

(56) References Cited

U.S. PATENT DOCUMENTS

| | | | |
|---|---|---|---|
| 8,744,385 B2 * | 6/2014 | Yahav | H03D 7/00 342/100 |
| 9,325,288 B2 * | 4/2016 | Tsukizawa | H03G 3/3042 |
| 2004/0137870 A1 | 7/2004 | Kivekas et al. | |
| 2004/0152435 A1 | 8/2004 | Pellat et al. | |
| 2005/0143044 A1 | 6/2005 | Kim | |
| 2005/0159130 A1 | 7/2005 | Yang et al. | |
| 2006/0057989 A1 * | 3/2006 | Wu | H03D 1/2272 455/190.1 |
| 2006/0068746 A1 | 3/2006 | Feng et al. | |
| 2009/0075620 A1 * | 3/2009 | Aniruddhan | H03D 7/1441 455/326 |
| 2015/0288412 A1 * | 10/2015 | Aalto | H04B 15/06 455/86 |

* cited by examiner

PROGRAMMABLE DRIVER FOR FREQUENCY MIXER

FIELD

The disclosure generally relates to drivers for frequency mixers.

BACKGROUND

Frequency mixers are used to mix two input signals in order to generate a new signal at a new frequency. A frequency mixer may input signals at two frequencies $f_1$, $f_2$, and mix them to create two new signals, one at the sum $f_1+f_2$, and the other at the difference $f_1-f_2$. Typically, only one of these new signals is used. For example, a frequency mixer in a radio receiver may be used to down-shift or frequency translate an incoming signal at a radio frequency by the frequency of an oscillator signal. The radio frequency signal may occupy a frequency range, in which case the frequency mixer may shift the frequency range of the radio frequency signal by the frequency of the oscillator signal. Frequency mixers can be used in radio signal receivers and transmitters, but their use is not limited thereto.

BRIEF SUMMARY

According to a first aspect of the present disclosure, there is provided a circuit for shifting a frequency range of a signal. The circuit comprises a frequency mixer having a signal input, an oscillator input, and a signal output. The circuit also comprises a frequency synthesizer configured to generate an oscillator signal. The circuit also comprises a programmable driver configured to receive the oscillator signal from the frequency synthesizer and to provide the oscillator signal to the oscillator input of the frequency mixer. The programmable driver is configured to have a variable drive strength. The circuit also comprises a controller configured to control the drive strength of the programmable driver based on a frequency of the oscillator signal to adjust a rise time and a fall time of the oscillator signal at the oscillator input of the frequency mixer. The frequency mixer is configured to output, at the signal output of the frequency mixer, a frequency range shifted version of a signal received at the signal input of the frequency mixer based on the frequency of the oscillator signal. Adjusting the rise time and the fall time of the oscillator signal at the oscillator input of the frequency mixer, based on the frequency of the oscillator signal, allows the frequency mixer to have good linearity and gain over a wide frequency range.

Optionally, in a second aspect in furtherance of the first aspect, the controller is further configured to control, in response to the frequency of the oscillator signal being a first frequency, the drive strength of the programmable driver to have a first drive strength to cause the rise time of the oscillator signal at the oscillator input to have a first rise time and the fall time of the oscillator signal at the oscillator input to have a first fall time. The controller is further configured to control, in response to the frequency of the oscillator signal being a second frequency, the drive strength of the programmable driver to have a second drive strength to cause the rise time of the oscillator signal at the oscillator input to have a second rise time and the rise time of the oscillator signal at the oscillator input to have a second fall time. The first drive strength is less than the second drive strength. The first frequency is lower than the second frequency. The first rise time is longer than the second rise time, and the first fall time is longer than the second fall time.

Optionally, in a third aspect in furtherance of the first or second aspect, the programmable driver comprises a plurality of stages. Also, the controller is configured to select one or more of the stages based on the frequency of the oscillator signal to select the drive strength of the programmable driver.

Optionally, in a fourth aspect in furtherance of the third aspect, each of the stages comprises one or more inverters. Also, the controller is configured to switch each inverter on or off based on the frequency of the oscillator signal to select the drive strength of the programmable driver.

Optionally, in a fifth aspect in furtherance of the third aspect, each of the plurality of stages has an input coupled to the frequency synthesizer to receive the oscillator signal. Also, each of the plurality of stages has an output coupled to the oscillator input of the frequency mixer.

Optionally, in a sixth aspect in furtherance of any of the first to fifth aspects, the circuit further comprises circuitry configured to apply bias voltages in the frequency mixer to counter an even order non-linearity in the frequency mixer while the controller controls the drive strength of the programmable driver.

Optionally, in a seventh aspect in furtherance of any of the first to sixth aspects, the frequency mixer comprises a first transistor having a first control terminal, a second transistor having a second control terminal, a third transistor having a third control terminal, a fourth transistor having a fourth control terminal, a first bias resistor coupled to the first control terminal, a second bias resistor coupled to the second control terminal, a third bias resistor coupled to the third control terminal, and a fourth bias resistor coupled to the fourth control terminal, wherein the oscillator signal comprises an in-phase signal and an out-of-phase signal, the in-phase signal is provided to the first control terminal and the second control terminal, the out-of-phase signal is provided to the third control terminal and the fourth control terminal, wherein the controller is configured to control a first voltage offset between a first bias voltage applied to the first bias resistor and a second bias voltage applied to the second bias resistor and to control a second voltage offset between a third bias voltage applied to the third bias resistor and a fourth bias voltage applied to the fourth bias resistor to counter a non-linearity in the frequency mixer.

Optionally, in an eighth aspect in furtherance of any of the first to seventh aspects, the circuit resides in a direct conversion receiver.

Optionally, in a ninth aspect in furtherance of any of the first to eighth aspects, the frequency mixer is a down-mixer.

According to one other aspect of the present disclosure there is provided a method of shifting a frequency range of a signal. The method comprises generating an oscillator signal having a frequency by a frequency synthesizer. The method comprises providing the oscillator signal from a programmable driver to an oscillator input of a frequency mixer, the programmable driver configured to have a variable drive strength. The method comprises controlling the drive strength of the programmable driver based on a frequency of the oscillator signal in order to adjust a rise time and a fall time of the oscillator signal at the oscillator input of the frequency mixer. The method comprises outputting a frequency range shifted version of a signal received at a signal input of the frequency mixer at a signal output of the frequency mixer based on the frequency of the oscillator signal.

According to still one other aspect of the present disclosure, there is provided a radio frequency (RF) signal receiver. The RF signal receiver comprises a frequency mixer having an oscillator signal input, an RF signal input, and a baseband signal output. The RF signal receiver comprises an amplifier coupled to the RF signal input and configured to provide an RF signal to the frequency mixer. The RF signal receiver comprises a local oscillator having a frequency synthesizer and a programmable driver coupled to the frequency synthesizer. The frequency synthesizer is configured to provide an oscillator signal having a frequency to the programmable driver. The programmable driver is coupled to the oscillator signal input of the frequency mixer to provide the oscillator signal to the oscillator signal input of the frequency mixer. The programmable driver is configured to have a programmable drive strength to adjust a rise time and a fall time of the oscillator signal at the oscillator signal input of the frequency mixer. The RF signal receiver comprises a controller configured to control the drive strength of the programmable driver based on the frequency of the oscillator signal to adjust the rise time and the fall time of the oscillator signal at the oscillator signal input of the frequency mixer. The frequency mixer is configured to output a baseband signal at the baseband signal output based on the RF signal and the oscillator signal.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate elements.

DETAILED DESCRIPTION

Figure 1:
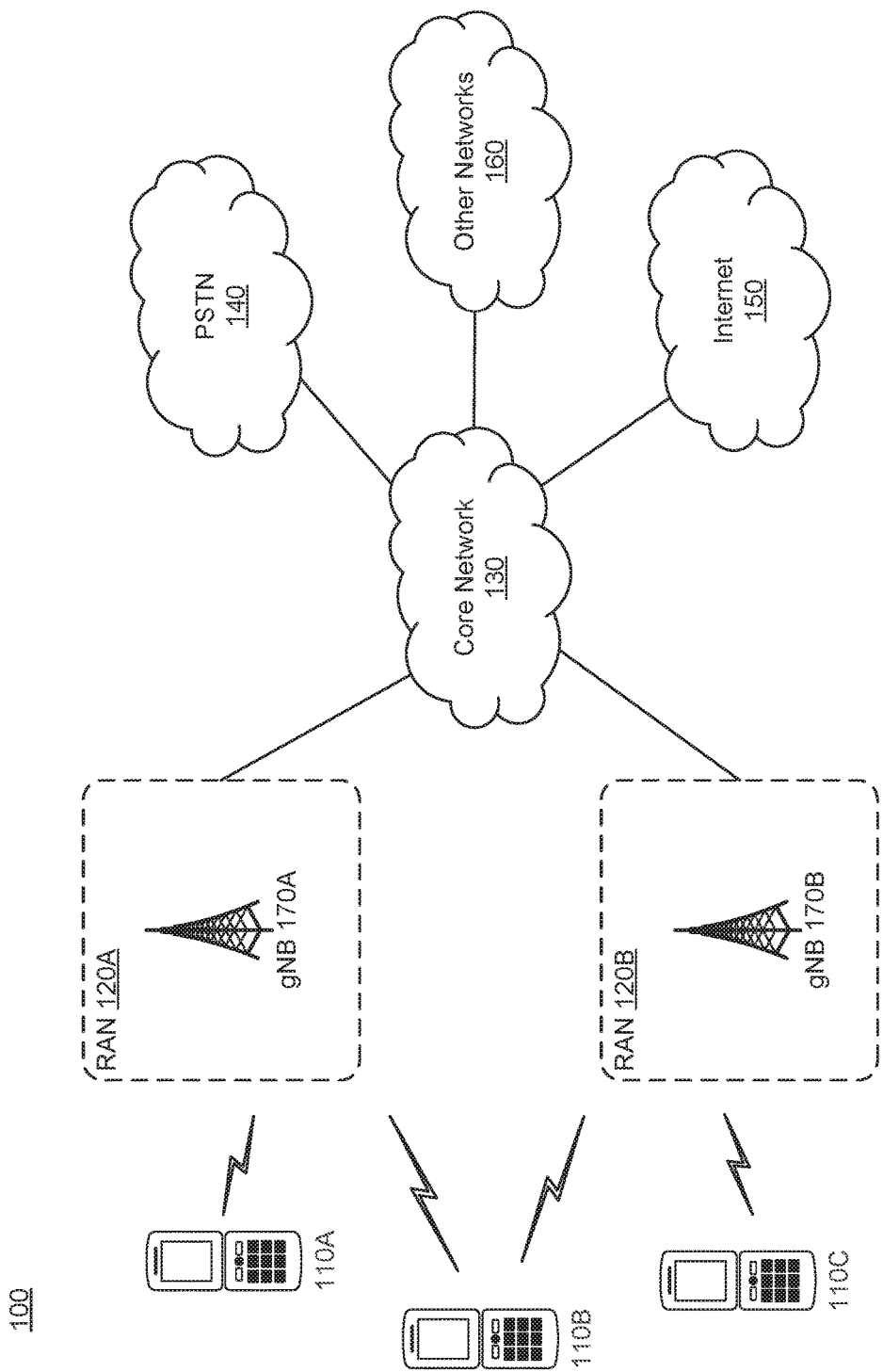
FIG. 1 illustrates a wireless network for communicating data.

The present disclosure will now be described with reference to the figures, which in general relate to drivers for frequency mixers.

A circuit for shifting a frequency range of a signal is disclosed herein. In one embodiment, the circuit has a programmable driver configured to provide an oscillator signal to an oscillator signal input of a frequency mixer. The circuit has a controller configured to control the drive strength of the programmable driver based on a frequency of the oscillator signal to adjust a rise time and a fall time of the oscillator signal at the oscillator input of the frequency mixer, in one embodiment. Adjusting the rise time and the fall time of the oscillator signal at the oscillator input of the frequency mixer, based on the frequency of the oscillator signal, allows the frequency mixer to provide good linearity and gain over a wide frequency range.

In one embodiment, a lower drive strength is used when the frequency of the oscillator signal is lower, which may facilitate reducing distortion in the frequency mixer and/or RF signal path. Having a lower drive strength for the programmable driver slows the rise and fall time of the oscillator signal at the oscillator input of the frequency mixer, in one embodiment. A slower rise and fall time of the oscillator signal at the oscillator input of the frequency mixer may reduce or eliminate distortion in the frequency mixer and/or RF signal path. Thus, at lower oscillator signal frequencies, non-linear distortion may be reduced or eliminated by using a lower drive strength of the programmable driver.

The frequency mixer may be prone to second order non-linear distortion due, at least in part, to mismatches of electronic components (e.g., transistors) in the frequency mixer. In one embodiment, an in-phase oscillator signal is applied to the gates of a first pair of transistors in the frequency mixer and a 180 degree out-of-phase oscillator signal is applied to the gates of a second pair of transistors in the frequency mixer. The gates of the first pair and/or the second pair may be referred to as "an oscillator signal input." In one embodiment, bias voltages are applied to the resistors connected to the gates of those transistors to create a second order distortion that counters the aforementioned second order non-linear distortion. For example, a first pair of resistors may be connected to the respective gates of the first pair of transistors, and a second pair of resistors may be connected to the respective gates of the second pair of resistors. By applying different bias voltages to the first pair of resistors and applying different bias voltages to the second pair of resistors, a "counter" second order non-linear distortion may be introduced. Thus, the net result is that the overall second order non-linear distortion of the frequency mixer may be reduced or eliminated.

However, the effectiveness of using the bias voltages to create the counter second order non-linear distortion may depend on the frequency of the oscillator signal. The effectiveness may be lower at lower oscillator signal frequencies. By slowing the rise and fall times of the oscillator signal at the oscillator signal input of the frequency mixer, the effectiveness of creating the counter second order non-linear distortion may be increased. Hence, when the oscillator signal frequency is lower, the overall second order non-linear distortion of the frequency mixer may be reduced or eliminated by reducing the drive strength of the programmable driver. Reducing the drive strength of the programmable driver at lower oscillator signal frequencies also reduces power consumption, in one embodiment.

When the frequency of the oscillator signal is higher, the drive strength of the programmable driver is stronger in order to have a faster rise and fall time of the oscillator signal at the oscillator signal input of the frequency mixer, in one embodiment. The faster rise and fall time helps to improve gain of the frequency mixer at higher oscillator signal frequencies. The faster rise and fall time may also help to improve linearity of the frequency mixer at higher oscillator signal frequencies For high frequencies, the oscillator signal should be fast enough to meet noise and gain specifications, in one embodiment. Thus, having a higher drive strength at higher oscillator signal frequencies can help to meet noise and gain specifications. For high frequencies, the rise/fall time of the oscillator signal is a large enough percentage of the period (of the oscillator signal) that the $2^{nd}$ order correction works properly. At lower oscillator signal frequencies, the rise/fall time of the oscillator signal (at the oscillator input of the frequency mixer) is slower so that the non-linearity correction works properly, in one embodiment.).

The same frequency mixer is used across a wide range of oscillator signal frequencies, in one embodiment. For example, the programmable driver may provide the oscillator signal to the oscillator signal input of the frequency mixer across a wide range of frequencies. Therefore, die area of a radio signal receiver and/or transmitter is reduced, relative to using separate frequency mixers for different oscillator signal frequencies.

It is understood that the present embodiments of the disclosure may be implemented in many different forms and that claim's scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

FIG. 1 illustrates a wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 ms (e.g. 100 or 200 microseconds), to communicate with the communication devices. In general, a base station may also be used to refer to any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as a UE 110, or collectively as the UEs 110, are configured to operate and/or communicate in the system 100. For example, a UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

Figure 2:
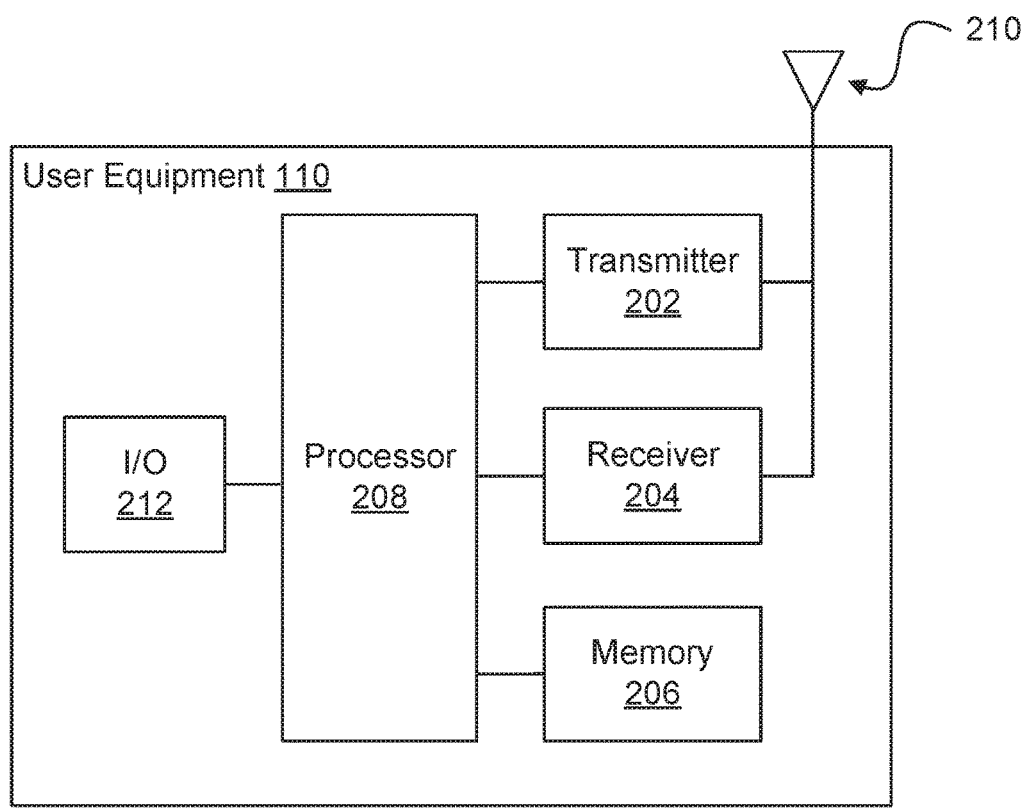
FIG. 2 illustrates example details of user equipment (UE) that may implement the methods and teachings according to this disclosure.

FIG. 2 illustrates example details of a UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and a frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 is an RF signal receiver, in some embodiments. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 208 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

Figure 3:
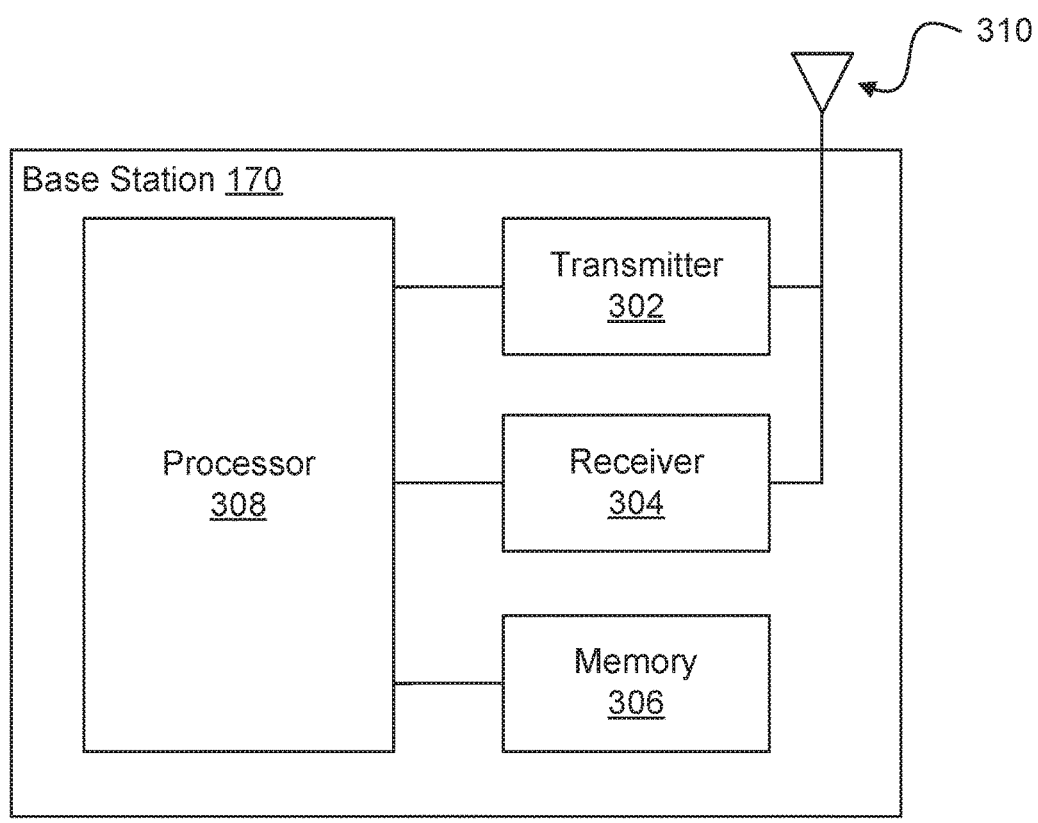
FIG. 3 illustrates an example base station that may implement the methods and teachings according to this disclosure.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Figure 4:
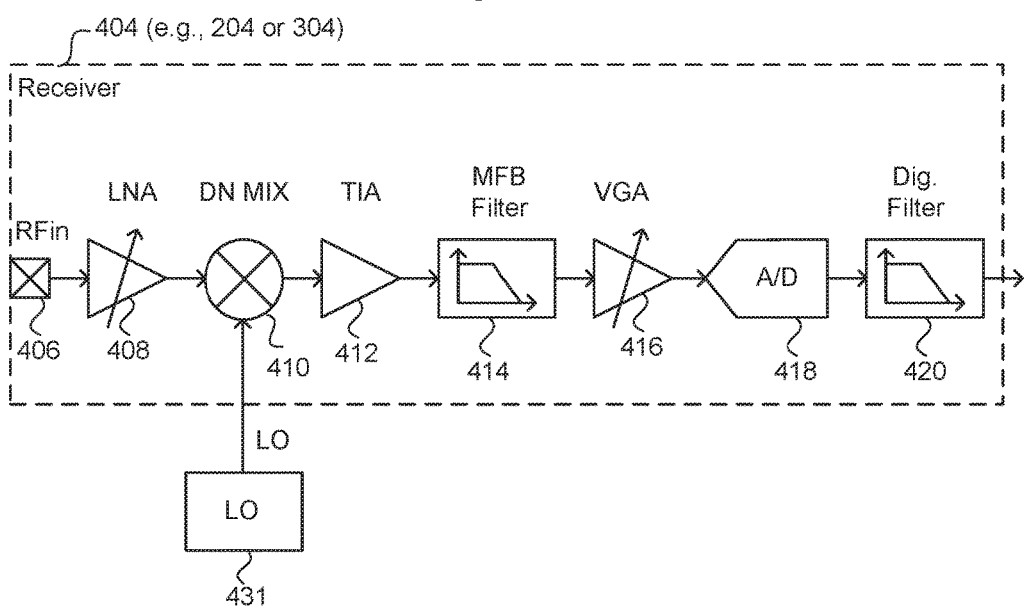
FIG. 4 illustrates a block diagram of one embodiment of a direct conversion receiver (DCR).

FIG. 4 illustrates a block diagram of one embodiment of a direct conversion receiver (DCR) 404, which can be the receiver 204 included in the UE 110 (shown in FIG. 2) or the receiver 304 included in the BS 170 (shown in FIG. 3), but is not limited thereto. The DCR 404 may also be referred to as a homodyne receiver or a zero-IF (Intermediate Frequency) receiver. The DCR 404 demodulates an incoming radio frequency (RF) signal using synchronous detection driven by a local oscillator (LO) 431. The frequency of the local oscillator 431 may be very close to or equal to the carrier frequency of the desired signal. The DCR 404 may also be referred to as an RF signal receiver.

Referring to FIG. 4, the receiver 404 is shown as including an input 406 at which is received as a radio frequency (RF) signal, and thus, the input 406 can also be referred to as the RF input 406. The RF input 406 can be coupled to an antenna or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR).

The amplified RF signal that is output by the LNA 408 is provided to a frequency mixer 410. The frequency mixer 410 may input signals at two frequencies $f_1$, $f_2$, and mix them to create two new signals, one at the sum $f_1+f_2$, and the other at the difference $f_1-f_2$. Typically, only one of these new signals is used. The frequency mixer 410 receives the amplifier RF signal from the LNA 408, and an oscillator signal (LO) from a local oscillator, as the two input signals. Thus, the frequency mixer 410 may create a new signal from the amplifier RF signal and the oscillator signal. The frequency mixer 410 may shift (e.g., decrease) a frequency of the amplifier RF signal by a frequency of the oscillator signal to create the new signal. The amplifier RF signal may occupy a frequency range, in which case the frequency mixer 410 may shift the frequency range of the amplifier RF signal by a frequency of the oscillator signal. The frequency mixer 410 in FIG. 4 is a down-mixer (DN MIX) that frequency down-converts the amplified RF signal from a relatively high frequency to a baseband frequency, in one embodiment.

Still referring to FIG. 4, the frequency down-converted signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MBF filter 414 low pass filters the frequency down-converted signal, to filter out high frequency signal components that are not of interest, such as HF noise. The filtered signal that is output from the MBF filter 414 is provided to a variable gain amplifier (VGA) 416, which is used to amplify the filtered signal before it provided to an analog-to-digital converter (A/D) 418, which converts the signal from an analog signal to a digital signal. The digital signal output from the A/D 418 is then provided to a digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

The local oscillator 431 may include a voltage-controlled oscillator (VCO), a digital controlled oscillator (DCO), or other circuit that provides the LO signal. In one embodiment, the local oscillator 431 includes a phase-locked loop (PLL), which contains a VCO. The LO signal is provided to the mixer 410 for use in the down-conversion process. Although shown as outside of receiver 404, depending on the embodiment, the local oscillator 431 can be formed on the same integrated circuit as one or more of the other elements in FIG. 4.

The receiver 204 in the UE 110 (shown in FIG. 2), as well as the receiver 304 included in the BS 170, are not limited to being direct conversion receivers. For example, receivers 204, 304 could be superheterodyne receivers that have a frequency mixer that changes the incoming radio signal to an intermediate frequency. After processing the intermediate frequency signal, the superheterodyne receiver may have a frequency mixer that down-converts the processed intermediate frequency signal to a baseband signal.

Figure 5:
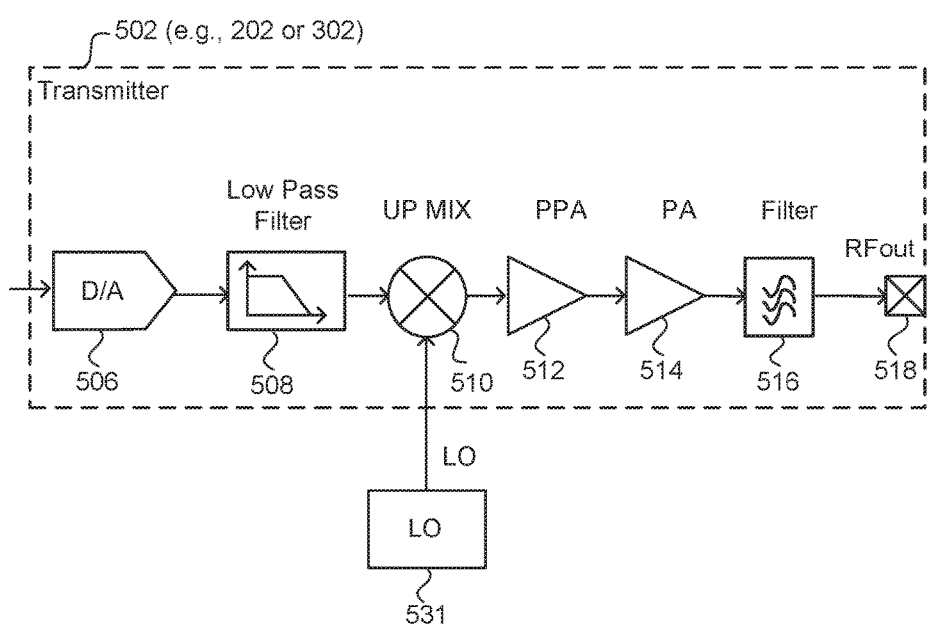
FIG. 5 illustrates details of one example of a direct conversion transmitter.

FIG. 5 illustrates details of one example of a direct conversion transmitter 502, which can be the transmitter 202 included in the UE 110 (shown in FIG. 2) or the transmitter 302 included in the BS 170 (shown in FIG. 3), but is not limited thereto. The direct conversion transmitter 502 may also be referred to as a direct modulation transmitter. Referring to FIG. 5, the transmitter 502 is shown as including an output 518 at which is provided as a radio frequency (RF) signal, and thus, the output 518 can also be referred to as the RF output 518. The RF output 518 can be coupled to an antenna or a coupler, but is not limited thereto. The RF signal provided by the RF output 518 is provided from a power amplifier PA 514 though the bandpass or notch filter 516. The filter 516 can, for example, be a duplex/SAW filter and is used to remove unwanted frequency components above and below the desired RF frequency range from the amplified RF output signal generated by PA 514. The power amp PA 514 receives its input from a power pre-amplifier PPA 512, which initially receives the up-converted signal to be transmitted from the mixer 510.

Still referring to FIG. 5 the signal to be transmitted is received from the processor 208 of UE 110 of FIG. 2 or processor 308 of BS 170 of FIG. 3 at the digital to analog converter 506, with the digitized signal being filtered by low pass filter 508 to initially remove any high frequency noise before being up-converted at the frequency mixer 510.

Frequency mixer 510 may input signals at two frequencies $f_1$, $f_2$, and mix them to create two new signals, one at the sum $f_1+f_2$, and the other at the difference $f_1-f_2$. Typically, only one of these new signals is used. The analog version of the signal ("analog signal") is provided to frequency mixer 510, as one input signal. Frequency mixer 510 also receives oscillator signal LO from a local oscillator, as the other input signal. Thus, the frequency mixer 510 may create a new signal from the analog signal and the oscillator signal. The frequency mixer 510 may shift (e.g., increase) a frequency of the analog signal by a frequency of the oscillator signal to create the new signal. In one embodiment, the analog signal is a baseband signal. The oscillator signal is used as a carrier wave, in one embodiment. In one embodiment, the frequency mixer 510 modulates the oscillator signal (e.g., carrier wave) with the baseband signal to generate a radio frequency signal.

The analog signal may occupy a frequency range, in which case the frequency mixer 510 may shift the frequency range of the analog signal by a frequency of the oscillator signal. The frequency mixer 510 in FIG. 5 is an up-mixer (UP MIX) that frequency up-converts the analog signal. In one embodiment, the frequency mixer 510 is an up-mixer (UP MIX) that frequency up-converts the analog signal to an RF signal.

The local oscillator signal LO in FIG. 5 can be provided by a local oscillator 531. The local oscillator 531 may contain a VCO, DCO, or other circuit that provides the LO signal. The local oscillator 531 includes a PLL that contains a VCO, in one embodiment. The LO signal is provided to the frequency mixer 510 for use in the up-conversion process. Although shown as outside of transmitter 502, depending on the embodiment, the local oscillator 531 can be formed on the same integrated circuit as one or more of the other elements in FIG. 5.

The transmitter 202 in the UE 110 (shown in FIG. 2), as well as the transmitter 302 included in the BS 170, are not limited to being direct conversion transmitters. For example, receivers 204, 304 could be superheterodyne transmitters that have a frequency mixer that shifts the analog signal to an intermediate frequency signal. The frequency mixer modulates an oscillator signal with the analog signal to generate the intermediate frequency signal, in one embodiment. After processing the intermediate frequency signal, the superheterodyne transmitter may have a frequency mixer that up-converts the processed intermediate frequency signal to a radio frequency signal.

Figure 6A:
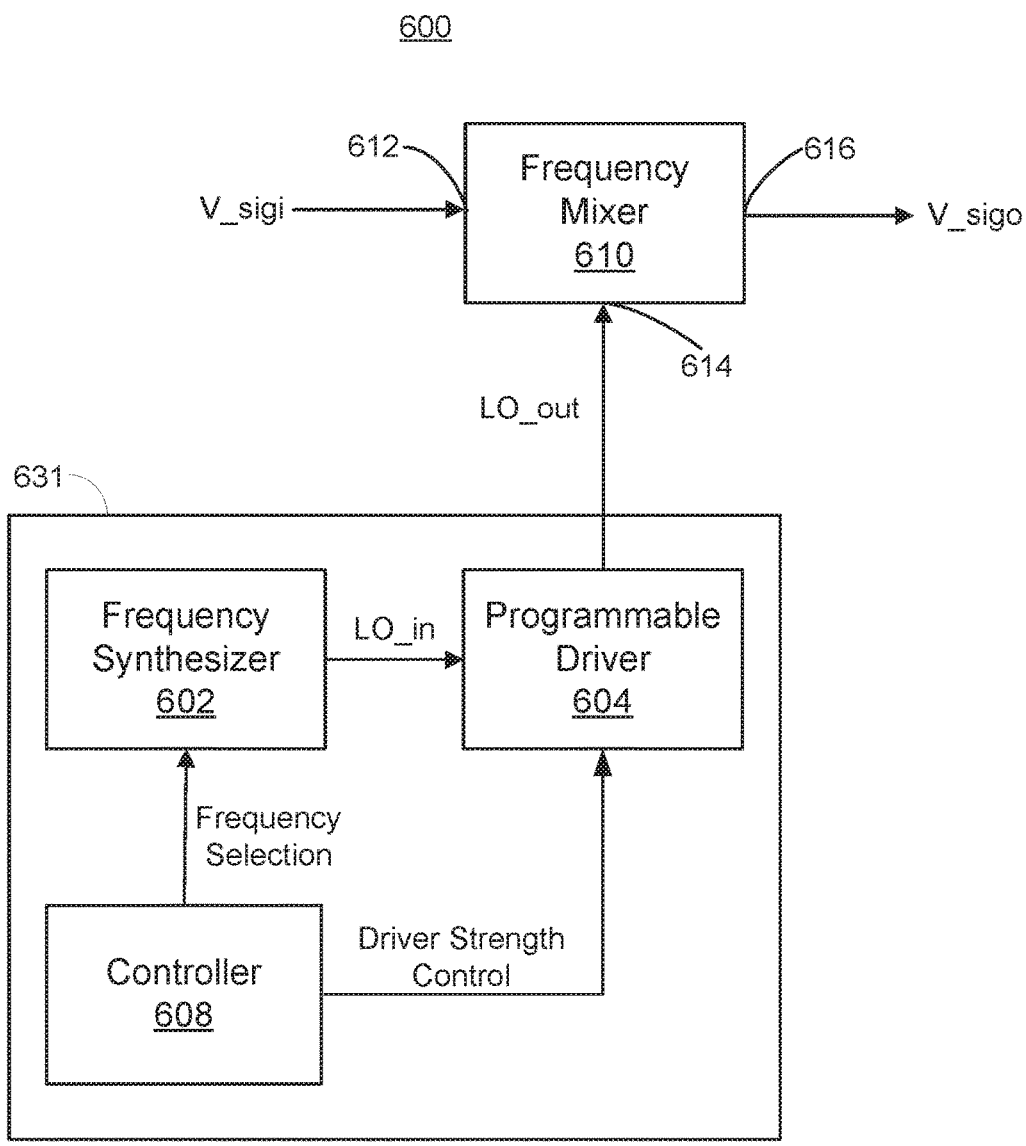
FIG. 6A is a diagram of a circuit for shifting a frequency range of a signal.

FIG. 6A is a diagram of a circuit 600 for shifting a frequency range of a signal. The circuit 600 has an oscillator 631 and a frequency mixer 610. The circuit 600 is included in a radio receiver, in one embodiment. The circuit 600 may be included in radio receiver 204 or 304, but is not limited to inclusion in those radio receivers. The circuit 600 may be included in a direct conversion receiver (e.g., DCR 404), a superheterordyne receiver, but is not limited thereto. In one embodiment, oscillator 631 is used to implement local oscillator 431 (FIG. 4) and the frequency mixer 610 is used to implement down-mixer 410. The circuit 600 is included in radio transmitter, in one embodiment. The circuit 600 may be included in radio transmitter 202 or 302, but is not limited to inclusion in those radio transmitters. The circuit 600 may be included in a direct conversion transmitter (e.g., transmitter 502), or a superheterordyne transmitter, but is not limited thereto. In one embodiment, oscillator 631 is used to implement local oscillator 531 (FIG. 5) and the frequency mixer 610 is used to implement up-mixer 510.

The frequency mixer 610 has a signal input 612 that receives an input signal (V_sigi). The frequency mixer 610 is configured to output, at a signal output 616 of the frequency mixer 610, a frequency range shifted version of the input signal based on a frequency of an oscillator signal (LO_out) received at an oscillator input 614 of the frequency mixer. The input signal (V_sigi) is a radio frequency signal, which is down-converted, in one embodiment. Thus, the input signal is an RF signal input, in one embodiment. The radio frequency signal is down-converted to a baseband signal, in one embodiment. The baseband signal may be output on the signal output 616, wherein the signal output 616 may be referred to as a baseband signal output. The radio frequency signal is down-converted to an intermediate frequency signal, in one embodiment. The input signal (V_sigi) is a baseband signal, which is up-converted to a radio frequency (RF) signal, in one embodiment. The input signal (V_sigi) is an intermediate frequency signal, which is up-converted to a radio frequency (RF) signal, in one embodiment. In one embodiment, the frequency mixer 610 modulates a carrier wave (e.g., oscillator signal) with the input signal.

The oscillator 631 has a frequency synthesizer 602, a programmable driver 604, and a controller 608. The frequency synthesizer 602 is configured to generate an oscillator signal (LO_in) that is provided to the programmable driver 604. The programmable driver 604 is coupled to an oscillator input 614 of the frequency mixer 610 to provide the oscillator signal (LO_out) to the frequency mixer 610.

The frequency synthesizer 602 may be any circuit that is capable of generating an oscillator signal. In one embodiment, the frequency synthesizer 602 includes a phase-locked loop (PLL). The PLL contains a voltage-controlled oscillator (VCO), in one embodiment. The PLL contains a digital controlled oscillator (DCO), in one embodiment. In one embodiment, the PLL receives a reference frequency signal that may be provided by, for example, a master oscillator. The PLL may contain components such as counters that may be used to divide the frequency of the reference frequency signal. In one embodiment, the controller 608 contains frequency selection logic that sends a control signal (referred to as "Frequency Selection" in FIG. 6A) to the PLL to control the frequency of the oscillator signal (LO_in). As one example, the controller 608 may issue a control signal to a programmable counter in the PLL in order to control the frequency of the oscillator signal (LO_in). The frequency synthesizer 602 is not required to contain a PLL.

The programmable driver 604 receives the oscillator signal (LO_in) from the frequency synthesizer 602 and provides the oscillator signal (LO_out) to an oscillator signal input 614 of the frequency mixer 610. The oscillator signals (LO_in, LO_out) have the same frequency. It is possible that the programmable driver 604 inverts the oscillator signal. Thus, LO_out is an inverted version of LO_in, in one embodiment. However, it is not required that LO_out be an inverted version of LO_in.

Both oscillator signals LO_in, LO_out are pulse waves, in one embodiment. A pulse wave is a periodic wave in which the amplitude alternates between fixed minimum and maximum values. The pulse wave may also be referred to as a rectangular wave. If the duty cycle is 50 percent, then the pulse wave is referred to as a square wave. The duty cycle of the oscillator signals is not required to be 50 percent.

Real world systems are typically not capable of generating oscillator signals that are exactly rectangular in shape. For example, instantaneous rise and fall times are typically not possible. Thus, it will be understood that the oscillator signals are not required to be perfect rectangular waves. Moreover, the characteristics of the oscillator signals LO_in, LO_out are not required to be the same. For example, the rise and fall time of LO_out may be slower than the rise and fall time of LO_in. The rise and fall times of the oscillator signals LO_in, LO_out are defined herein with respect to 10 percent and 90 percent points of amplitude of the waveform.

Figure 6B:
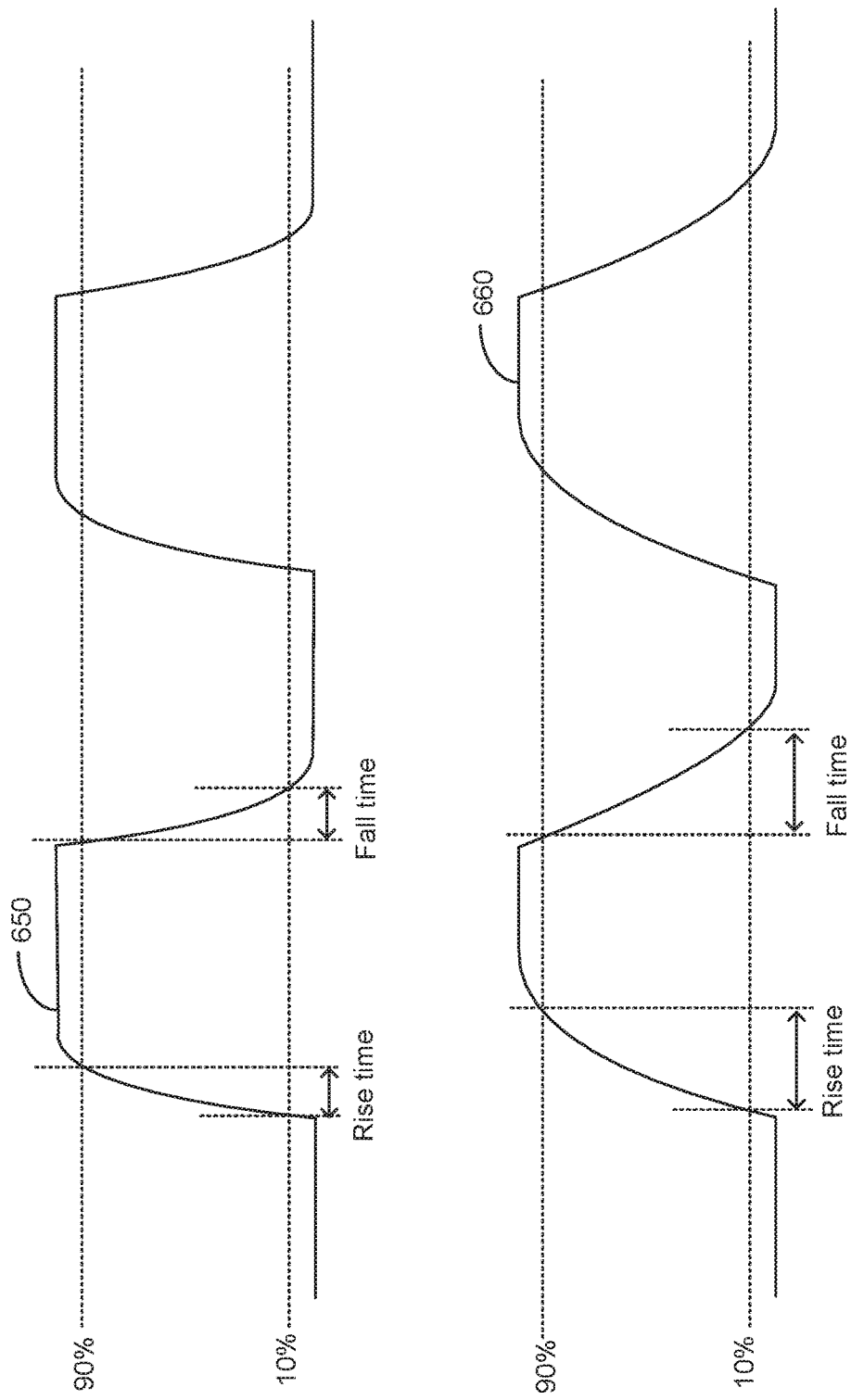
FIG. 6B depicts two oscillator signals to illustrate rise and fall times.

FIG. 6B depicts two oscillator signals to illustrate rise and fall times. Waveform 650 is an example of an oscillator signal LO_in, which may be generated by the frequency synthesizer 602. Waveform 660 is an example of an oscillator signal LO_out, which may be generated by the programmable driver 604. For each waveform 650 and 660, dashed line labeled "10%" indicates when the waveform is at 10 percent of the difference between the maximum and minimum amplitudes. For each of waveforms 650 and 660, dashed line labeled "90%" indicates when the waveform is at 90 percent of the difference between the maximum and minimum amplitudes. The rise time is defined herein as the time it takes to increase from the 10 percent point to the 90 percent point. The fall time is defined herein as the time it takes to decrease from the 90 percent point to the 10 percent point. In this example, waveform 660 has a slower rise time (also known as a longer rise time) than waveform 650, but that is not required. In this example, waveform 660 also has a slower fall time (also known as a longer fall time) than waveform 650, but that is not required.

Referring again to FIG. 6A, the programmable driver 604 is configured to have a variable drive strength. The drive strength refers to the ability to provide a current to a load connected to the programmable driver 604. Thus, when the drive strength is higher, the programmable driver 604 is able to provide more current to the load. In FIG. 6A, the load is at the oscillator input 614 of the frequency mixer 610. Providing a higher current provides a faster charge and discharge of a capacitance in, for example, the frequency mixer 610.

The drive strength may be controlled by applying one or more control signals to the programmable driver 604. The control signals are labeled "Driver Strength Control" in FIG. 6A. Hence, the programmable driver 604 may be said to have a programmable drive strength. The controller 608 is configured to control the drive strength of the programmable driver 604 based on a frequency of the oscillator signal (LO_in) to adjust a rise time and a fall time of the oscillator signal (LO_out) at an oscillator input of the frequency mixer 610. The rise and fall time of the oscillator signal at the oscillator input of the frequency mixer 610 may be a factor in gain and linearity of the frequency mixer 610. Thus, by adjusting the rise time and fall time of the oscillator signal (LO_out) at the oscillator input of the frequency mixer 610, gain and/or linearity of the frequency mixer 610 may be improved.

In one embodiment, the controller 608 is configured to program programmable driver 604 to have lower drive strengths at lower oscillator signal frequencies and higher drive strengths at higher oscillator signal frequencies. The lower drive strengths result in slower rise and fall times of the oscillator signal at the oscillator input of the frequency mixer 610. The slower rise and fall times in combination with non-linearity cancellation circuitry may reduce or eliminate distortion in the frequency mixer 610 at lower oscillator signal frequencies. The higher drive strengths result in faster rise and fall times of the oscillator signal at the oscillator input of the frequency mixer 610. The faster rise and fall times will provide good mixer gain while still enabling non-linearity cancellation circuitry to reduce or eliminate distortion in the frequency mixer 610 at higher oscillator signal frequencies.

Also, the same frequency mixer 610 can be used across a wide range of oscillator signal frequencies. For example, the same frequency mixer 610 can be used at the lower oscillator signal frequencies when the lower drive strengths are used, as well as the higher oscillator signal frequencies when the stronger drive strengths are used. As one example, the same frequency mixer 610 can be used across a range of oscillator signal frequencies typically used in a cellular telephone.

FIG. 6A depicts one programmable driver 604, which inputs one oscillator signal (LO_in) and outputs one oscillator signal (LO_out). In one embodiment, the frequency synthesizer 602 generates multiple different oscillator signals, which each having the same frequency but differ in phase. For example, the frequency synthesizer 602 may have a quadrature signal generator, which accepts an oscillator signal and outputs two oscillator signals having the same frequency, but differing in phase by 90 degrees. The oscillator 631 has one programmable driver 604 for each oscillator signal provided by the frequency synthesizer 602, in one embodiment. In one embodiment, two programmable drivers 604 provide a corresponding two oscillator signals to the same frequency mixer 610. In one embodiment, the two oscillator signals that are provided to the same frequency mixer 610 have the same frequency but are out of phase from each other by 180 degrees. In one embodiment, two or more programmable drivers 604 provide a corresponding two or more oscillator signals to different frequency mixers. For example, one frequency mixer 610 can be used for an I-channel and another frequency mixer 610 for a Q-channel. Although the controller 608 is depicted as part of the oscillator 631, all or a portion of the controller 608 may be separate from the oscillator 631.

Figure 7:
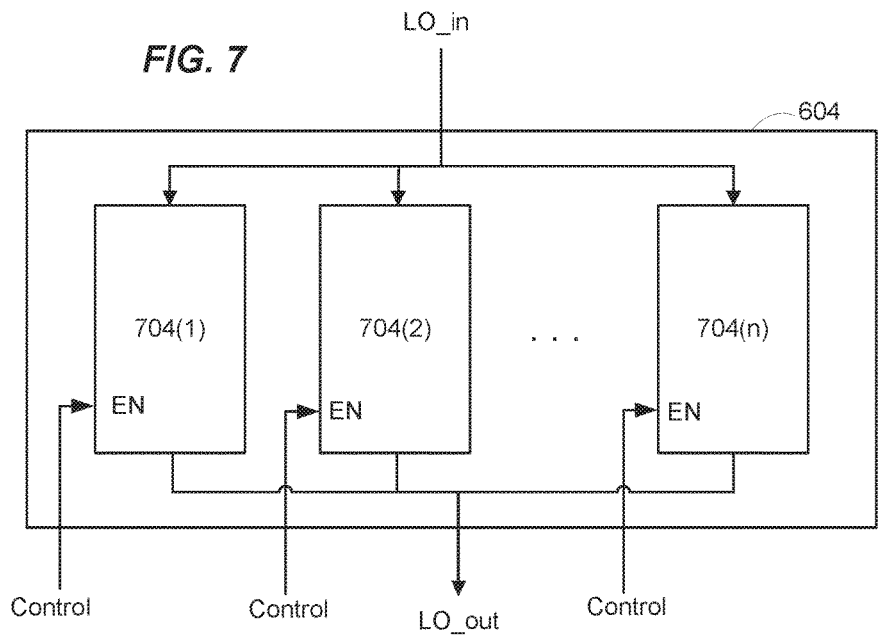
FIG. 7 is a block diagram of one embodiment of a programmable driver.

FIG. 7 is a block diagram of one embodiment of a programmable driver 604. The programmable driver 604 of FIG. 7 may be used in local oscillator 431, local oscillator 531, or oscillator 631, but is not limited thereto. The programmable driver 604 of FIG. 7 comprises a number of stages 704(1), 704(2), . . . 704(n). The reference numeral 704 will be used to refer to a stage in general, without reference to a particular stage. Each stage 704 accepts the local oscillator signal (LO_in). The local oscillator signal (LO_in) is provided by the frequency synthesizer 602 (see FIG. 6A), in one embodiment. Each stage 704 has an enable input (EN), in one embodiment. The enable input (EN) is used to enable the stage to cause the stage to output the local oscillator signal (LO_out). The outputs of the stages 704 are connected together. Each stage 704 is able to provide an amount of current, in one embodiment. Thus, the total current that is provided by the programmable driver 604 may be the sum of the currents provided by the enabled stages 704.

The drive strength of the programmable driver 604 may be controlled by the number of stages 704 that are selected. In one embodiment, each stage 704 has the same drive strength. However, different stages could have different drive strengths. For example, there may be a binary relationship between the drive strengths of each of the stages 704. A binary relationship in this context means that the strength relationship is a power of two. For example, the drive strength of four different stages 704 can be respectively 8x, 4x, 2x, x, where "x" is the drive strength of the weakest stage 704. In one embodiment, the controller 608 is configured to select one or more of the stages 704 based on the frequency of the oscillator signal to select the drive strength of the programmable driver 604.

Figure 8A:
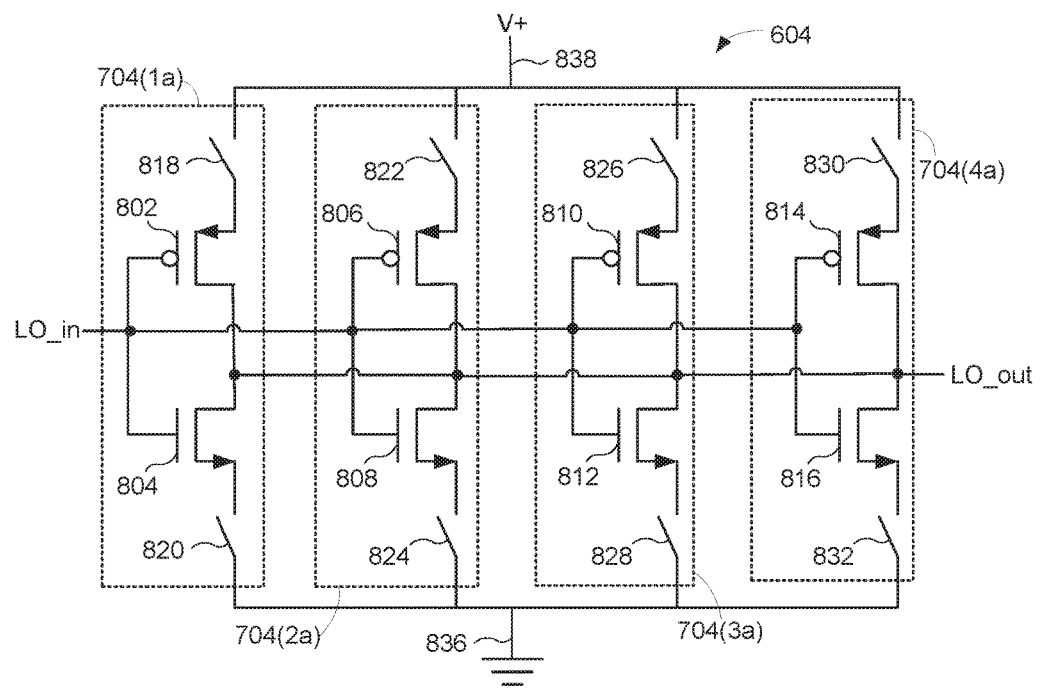
FIG. 8A is a schematic diagram of one embodiment of a programmable driver.

FIG. 8A is a schematic diagram of one embodiment of a programmable driver 604. The programmable driver 604 of FIG. 8A is one embodiment of the programmable driver of FIG. 7. The programmable driver 604 of FIG. 8A may be used in local oscillator 431, local oscillator 531, oscillator 631, but is not limited thereto.

The programmable driver 604 of FIG. 8A has four stages 704(1a), 704(2a), 704(3a), and 704(4a). Each stage 704 includes an inverter, in the embodiment of FIG. 8A. Each inverter includes a PMOS transistor and an NMOS transistor.

Stage 704(1a) includes PMOS transistor 802 and NMOS transistor 804. The gates of the two transistors 802, 804 are connected together and serve as an input that receives the oscillator signal (LO_in). Oscillator signal (LO_in) may be provided by the frequency synthesizer 602. The drains of the two transistors 802, 804 are connected together and serve as an output that provides the oscillator signal (LO_out), assuming that the stage 704(1a) is enabled. Oscillator signal (LO_out) may be provided to the oscillator signal input of the frequency mixer 610.

Stage 704(1*a*) includes switch 818 between the PMOS transistor 802 and a positive voltage terminal 838. Stage 704(1*a*) includes switch 820 between the NMOS transistor 804 and ground 836. In one embodiment, stage 704(1*a*) is enabled by closing switch 818 to connect PMOS transistor 802 to the positive voltage terminal 838, and closing switch 820 to connect NMOS transistor 804 to the ground 836. In one embodiment, stage 704(1*a*) is disabled by opening switch 818 to disconnect PMOS transistor 802 from the positive voltage terminal 838, and opening switch 820 to disconnect NMOS transistor 804 from the ground 836.

Stages 704(2*a*), 704(3*a*), and 704(4*a*) each have similar components, and operate in a similar manner as just described for stage 704(1*a*). Stage 704(2*a*) includes PMOS transistor 806 and NMOS transistor 808. The gates of the two transistors 806, 808 are connected together and serve as an input that receives the oscillator signal (LO_in). The drains of the two transistors 806, 808 are connected together and serve as an output that provides the oscillator signal (LO_out), assuming that the stage 704(2*a*) is enabled. Stage 704(2*a*) includes switch 822 between the PMOS transistor 806 and the positive voltage terminal 838. Stage 704(2*a*) includes switch 824 between the NMOS transistor 808 and ground 836. The switches 822, 824 operate for stage 704(2*a*) in a similar manner as switches 818, 820 operate for stage 704(1*a*).

Stage 704(3*a*) includes PMOS transistor 810 and NMOS transistor 812. The gates of the two transistors 810, 812 are connected together and serve as an input that receives the oscillator signal (LO_in). The drains of the two transistors 810, 812 are connected together and serve as an output that provides the oscillator signal (LO_out), assuming that the stage 704(3*a*) is enabled. Stage 704(3*a*) includes switch 826 between the PMOS transistor 810 and the positive voltage terminal 838. Stage 704(3*a*) includes switch 828 between the NMOS transistor 812 and ground 836. The switches 826, 828 operate for stage 704(3*a*) in a similar manner as switches 818, 820 operate for stage 704(1*a*).

Stage 704(4*a*) includes PMOS transistor 814 and NMOS transistor 816. The gates of the two transistors 814, 816 are connected together and serve as an input that receives the oscillator signal (LO_in). The drains of the two transistors 814, 816 are connected together and serve as an output that provides the oscillator signal (LO_out), assuming that the stage 704(4*a*) is enabled. Stage 704(4*a*) includes switch 830 between the PMOS transistor 814 and the positive voltage terminal 838. Stage 704(4*a*) includes switch 832 between the NMOS transistor 816 and ground 836. The switches 830, 832 operate for stage 704(4*a*) in a similar manner as switches 818, 820 operate for stage 704(1*a*).

The drive strength of the programmable driver 604 of FIG. 8A may be controlled by enabling/disabling different subsets of the stages 704. As discussed above, each of the stages 704 can be individually enabled/disabled by use of the switches 818-832. The switches 818-832 are implemented with transistors, in one embodiment. In one embodiment, switches 818, 822, 826, and 830 are PMOS transistors, whereas switches 820, 824, 828, and 832 are NMOS transistors. The switches 818-832 are significantly larger (e.g., larger width) than the inverter transistors 802-816, in one embodiment.

In one embodiment, each stage 704 of the programmable driver 604 of FIG. 8A has the same strength. Thus, each stage 704 is able to provide the same amount of current to a load to which the oscillator signal LO_out is provided, in one embodiment. In one embodiment, the PMOS transistors 802, 806, 810, and 814 are alike in size (e.g., the same W/L), and the NMOS transistors 804, 808, 812, and 816 are alike in size (e.g., the same W/L), in order to provide the same drive strength for each stage 704.

It is not required for each stage 704 of the programmable driver 604 of FIG. 8A to have the same strength. Also, it is not required that the corresponding transistors in each stage 704 be alike in size. For example, the PMOS transistors 802, 806, 810, and 814 in the different stages 704 could have different sizes from each other (e.g., different W/L). Likewise, the NMOS transistors 804, 808, 812, and 816 in the different stages 704 could have different sizes from each other (e.g., different W/L).

In one embodiment, the drive strength of the stages 704 of the programmable driver 604 of FIG. 8A have a binary relationship. For example, stage 704(4*a*) has twice the drive strength of stage 704(3*a*); stage 704(3*a*) has twice the drive strength of stage 704(2*a*); and stage 704(2*a*) has twice the drive strength of stage 704(1*a*), in one embodiment. Thus, stage 704(4*a*) has eight times the drive strength of stage 704(1*a*), in one binary relationship embodiment. A binary relationship can provide for a high number of different drive strengths with a relatively few stages 704.

Figure 8B:
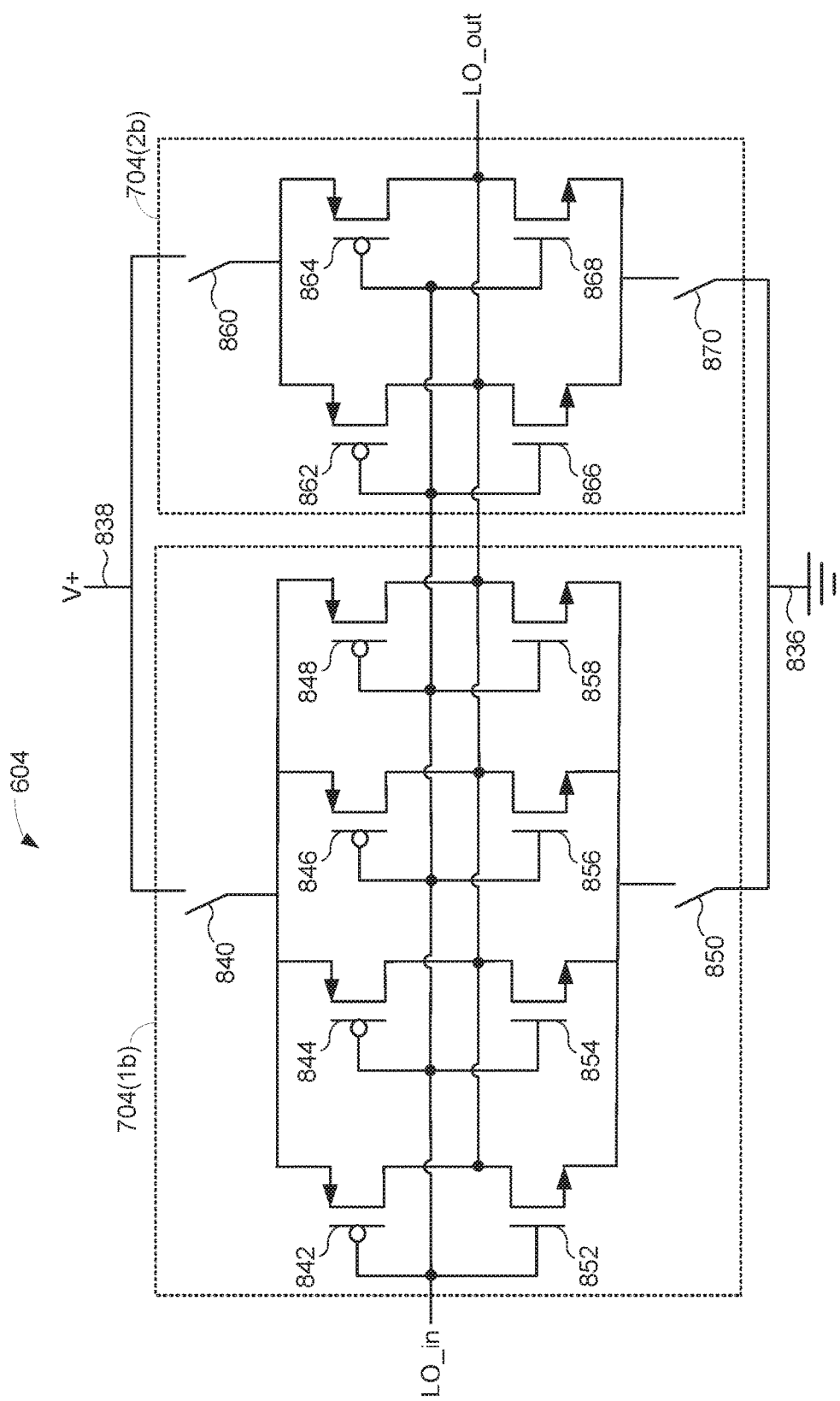
FIG. 8B is a schematic diagram of an embodiment of a programmable driver in which the stages have a different number of inverters from each other.

Although the embodiment of FIG. 8A depicts one inverter (e.g., one PMOS/NMOS transistor pair per stage 704), in another embodiment, a stage 704 includes more than one inverter. Moreover, different stages 704 may contain different numbers of inverters. This is one technique for achieving a different drive strength in the different stages. FIG. 8B is a schematic diagram of an embodiment of a programmable driver 604 in which the stages 704 have a different number of inverters from each other. Stage 704(1*b*) has four inverters, whereas stage 704(2*b*) has two inverters.

Stage 704(1*b*) has PMOS transistors 842, 844, 846, and 848. Stage 704(1*b*) has NMOS transistors 852, 854, 856, and 858. Stage 704(1*b*) has a single switch 840 between the four inverters and the positive voltage terminal 838. Stage 704 (1*b*) has a single switch 850 between the four inverters and the ground 836.

Stage 704(2*b*) has PMOS transistors 862 and 864. Stage 704(2*b*) has NMOS transistors 866 and 868. Stage 704(2*b*) has a single switch 860 between the two inverters and the positive voltage terminal 838. Stage 704(2*b*) has a single switch 870 between the two inverters and the ground 836.

The concept of having a different number of inverters per stage may be extended. For example, to achieve a binary relationship, the circuit of FIG. 8A may be modified such that stage 704(4*a*) has eight inverters, stage 704(3*a*) has four inverters, stage 704(2*a*) has two inverters, and stage 704(1*a*) has one inverter, in one embodiment. In one binary relationship embodiment in which a different number of inverters is used in each stage 704, the transistors in each of the inverters may be alike in size (e.g., W/L).

Figure 8C:
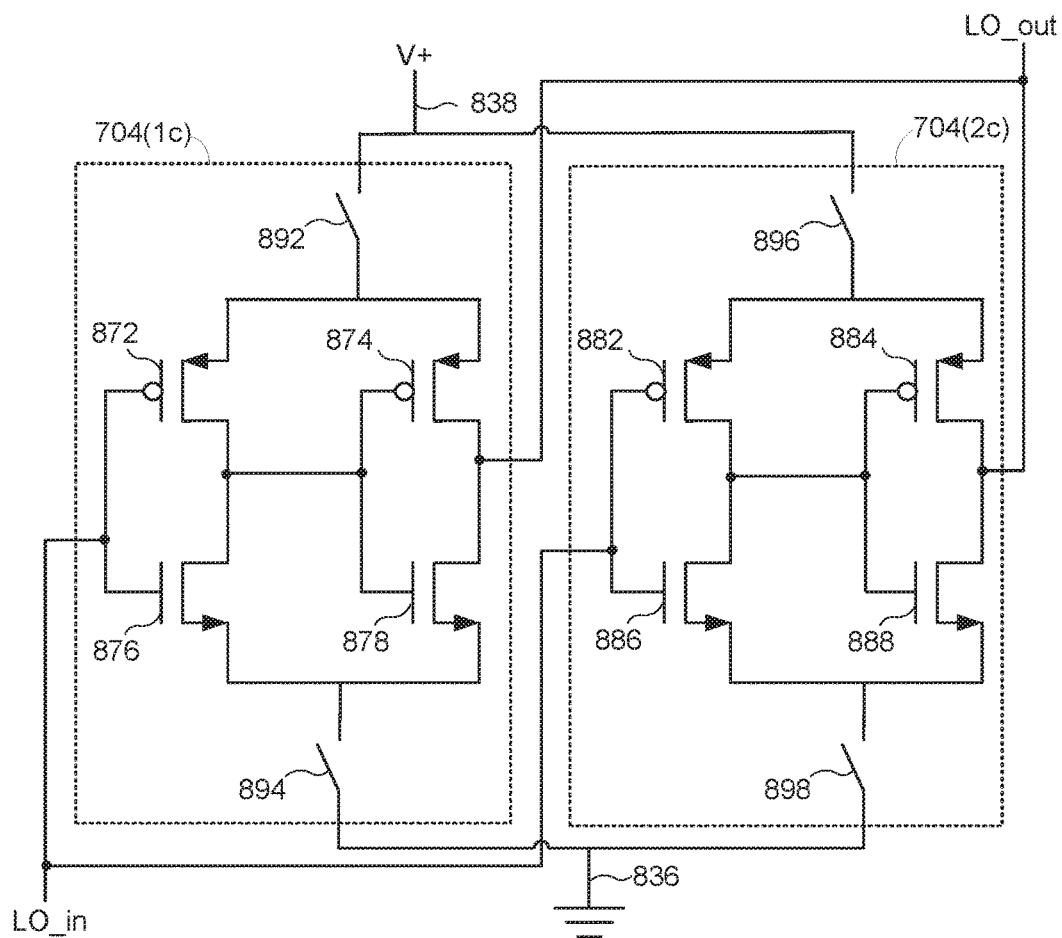
FIG. 8C depicts a schematic of one embodiment of a programmable driver in which each stage has a buffer.

The stages 704 in the programmable driver 604 are not required to include inverters. In one embodiment, each stage has a buffer instead of an inverter. FIG. 8C depicts a schematic of one embodiment of a programmable driver 604 in which each stage 704(1*c*), 704(2*c*) has a buffer.

Stage 704(1*c*) has PMOS transistor 872, PMOS transistor 874, NMOS transistor 876, and NMOS transistor 878, which together form a buffer. Switch 892 is between the buffer and the positive voltage terminal 838. Switch 894 is between the buffer and ground 836.

Stage 704(2*c*) has PMOS transistor 882, PMOS transistor 884, NMOS transistor 886, and NMOS transistor 888, which together form a buffer. Switch 896 is between the buffer and the positive voltage terminal 838. Switch 898 is between the buffer and ground 836.

The oscillator signal (LO_in) is provided to the gates of PMOS transistor 872 and NMOS transistor 876 in stage 704(1c). The oscillator signal (LO_in) is also provided to the gates of PMOS transistor 882 and NMOS transistor 886 in stage 704(2c).

When stage 704(1c) is enabled, the oscillator signal (LO_out) is provided from the drains of PMOS transistor 874 and NMOS transistor 878. When stage 704(2c) is enabled, the oscillator signal (LO_out) is provided from the drains of PMOS transistor 884 and NMOS transistor 888.

Other alternatives are possible for the components in the stages 704 of the programmable driver. In one embodiment, bipolar transistors (e.g., BJT) are used instead MOSFETs. In the examples of FIGS. 8A-8C, the stages 704 are connected between a positive voltage terminal 838 and a ground 836. More generally, the stages 704 may be connected between a first voltage terminal and a second voltage terminal, wherein it is not required that one of the terminals be connected to a ground. For example, the stages 704 may be connected between a positive voltage terminal 838 and negative voltage terminal.

Figure 9:
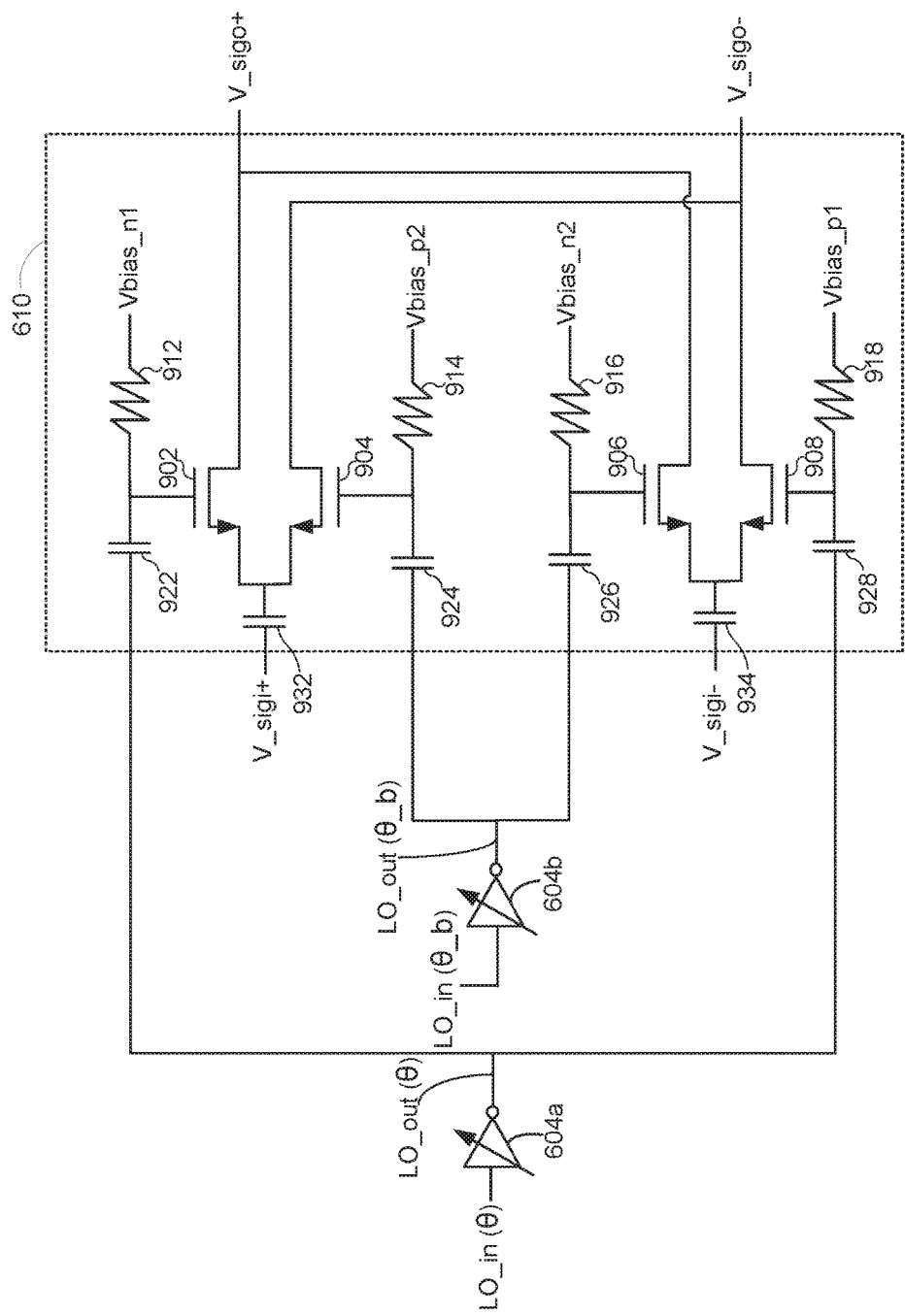
FIG. 9 is a schematic diagram of one embodiment of a frequency mixer, and a pair of programmable drivers.

FIG. 9 is a schematic diagram of one embodiment of a frequency mixer 610, and a pair of programmable drivers 604a, 604b. In this embodiment, two programmable drivers are used in order to provide two local oscillator signals having a different phase from each other. Programmable driver 604a receives local oscillator signal LO_in(θ) and outputs local oscillator signal LO_out (θ), which is referred to herein as an "in-phase oscillator signal." Programmable driver 604b receives local oscillator signal LO_in(θ_b) and outputs local oscillator signal LO_out (θ_b), which is referred to herein as an "out-of-phase oscillator signal. In one embodiment, the two local oscillator signals (both input and output) are separated in phase by 180 degrees and are 25% duty cycle pulses. The oscillator signal could have a different duty cycle when used with a different frequency mixer. For example, the oscillator signal could have a 50 percent duty cycle when used with some frequency mixers.

The frequency mixer 610 of FIG. 9 has a signal input that receives V_sigi+ and V_sigi−. V_sigi+ is provided to capacitor 932, and V_sigi− is provided to capacitor 934. Capacitors 932, 934 may shift the DC level of V_sigi. The frequency mixer 610 has a signal output that outputs V_sigo+ and V_sigo−. V_sigo+ is output at the drains of transistors 902, 906. V_sigo− is output at the drains of transistors 904, 908.

The local oscillator signal LO_out(θ) from programmable driver 604a is provided to one oscillator signal input of the frequency mixer 610. Specifically, the local oscillator signal LO_out(θ) is provided to the gates of transistors 902 and 908, which may be considered to be an oscillator signal input. Capacitor 922 is connected to the gate of transistor 902 and capacitor 928 is connected to the gate of transistor 908 in order to provide the local oscillator signal LO_out(θ) to the gates of transistors 902, 908. Capacitors 922, 928 may shift the DC level of the local oscillator signal LO_out(θ). The strength of programmable driver 604a is controlled in order to control the rise and fall times of the local oscillator signal LO_out(θ) at the gates of transistors 902, 908, in one embodiment.

The local oscillator signal LO_ out(θ_b) from programmable driver 604b is provided to another oscillator signal input of the frequency mixer 610. Specifically, the local oscillator signal LO_out(θ_b) is provided to the gates of transistors 904 and 906, which may be considered to be an oscillator signal input. Capacitor 924 is connected to the gate of transistor 904 and capacitor 926 is connected to the gate of transistor 906 in order to provide the local oscillator signal LO_out(θ_b) to the gates of transistors 904, 906. Capacitors 924, 926 may shift the DC level of the local oscillator signal LO_out(θ_b). The strength of programmable driver 604b is controlled in order to control the rise and fall times of the local oscillator signal LO_out(θ_b) at the gates of transistors 904, 906, in one embodiment.

The frequency mixer 610 in FIG. 9 has a differential design, which may help to reduce even order non-linearities, such as second order non-linearities. However, there may be mismatches between components. For example, the widths of the various transistors 902, 904, 906, 908 might not be the same. Such mismatches can play a role in introducing even order non-linearities. Were the transistors 902, 904, 906, 908 to be made very large, then the percent mismatch could be reduced. However, this comes at the expense of having transistors that draw more current, as well as take up more space. Hence, a practical design for the frequency mixer 610 may result in even order non-linearities being created when the frequency mixer 610 mixes its input signals. Second order non-linearities are often the most significant of the even order non-linearities.

The frequency mixer 610 in FIG. 9 has several bias resistors 912, 914, 916, 918. Voltages may be applied to these resistors to reduce or eliminate non-linearities, such as second order non-linearities. Other even order non-linearities may also be reduced or eliminated. In one embodiment, voltages are applied to the bias resistors 912, 914, 916, 918 to create an electrical mismatch between the devices, which creates a "counter" second order non-linearity in order to counter the second order non-linearity that is due, at least in part, to component mismatches. Bias resistor 912 is connected to the gate of transistor 902. Bias resistor 912 is provided with bias voltage Vbias_n1. Bias resistor 916 is connected to the gate of transistor 906. Bias resistor 916 is provided with bias voltage Vbias_n2. Bias resistor 914 is connected to the gate of transistor 904. Bias resistor 914 is provided with bias voltage Vbias_p2. Bias resistor 918 is connected to the gate of transistor 908. Bias resistor 918 is provided with bias voltage Vbias_p1.

In one embodiment, the magnitude of Vbias_n1 that is applied to resistor 912 is the same as the magnitude of Vbias_n2 that is applied resistor 916. In one embodiment, the magnitude of Vbias_p2 that is applied to resistor 914 is the same as the magnitude of Vbias_p1 that is applied resistor 918. However, it is not required that Vbias_n1 be equal in magnitude to Vbias_n2. Likewise, it is not required that Vbias_p1 be equal in magnitude to Vbias_p2. A first offset between Vbias_p1 and Vbias_n1 and a second offset between Vbias_p2 and Vbias_n2 may be used to create the counter second order non-linearity. In one embodiment, the first offset and the second offset are equal in magnitude and polarity. However, it is not required that the first offset and the second offset be equal in magnitude or polarity. In one embodiment, for no second order distortion correction, Vbias_p1 is equal to Vbias_n1 and Vbias_p2 is equal to Vbias_n2. The "p" and "n" bias voltages are moved in the opposite direction in order to provide second order distortion to correction, in one embodiment. For example, either Vbias_p1 and Vbias_p2 are increased while Vbias_n1 and Vbias_n2 are decreased or, alternatively, Vbias_p1 and Vbias_p2 are decreased while Vbias_n1 and Vbias_n2 are increased, depending on the correction that is needed.

The frequency mixer 610 of FIG. 9 depicts one technique to reduce or eliminate even order non-linearities. However, the programmable driver 604 can be used with frequency mixers that use other techniques to reduce or eliminate even order non-linearities. Also, the programmable driver 604 can be used with frequency mixers that do not employ any technique to reduce or eliminate even order non-linearities. Thus, the programmable driver 604 can be used with a frequency mixer that does not apply bias voltages to create a counter second order non-linearity, as in the example of FIG. 9. Also, the programmable driver 604 can be used with a frequency mixer that has a different circuit configuration than the circuit in FIG. 9.

Figure 10:
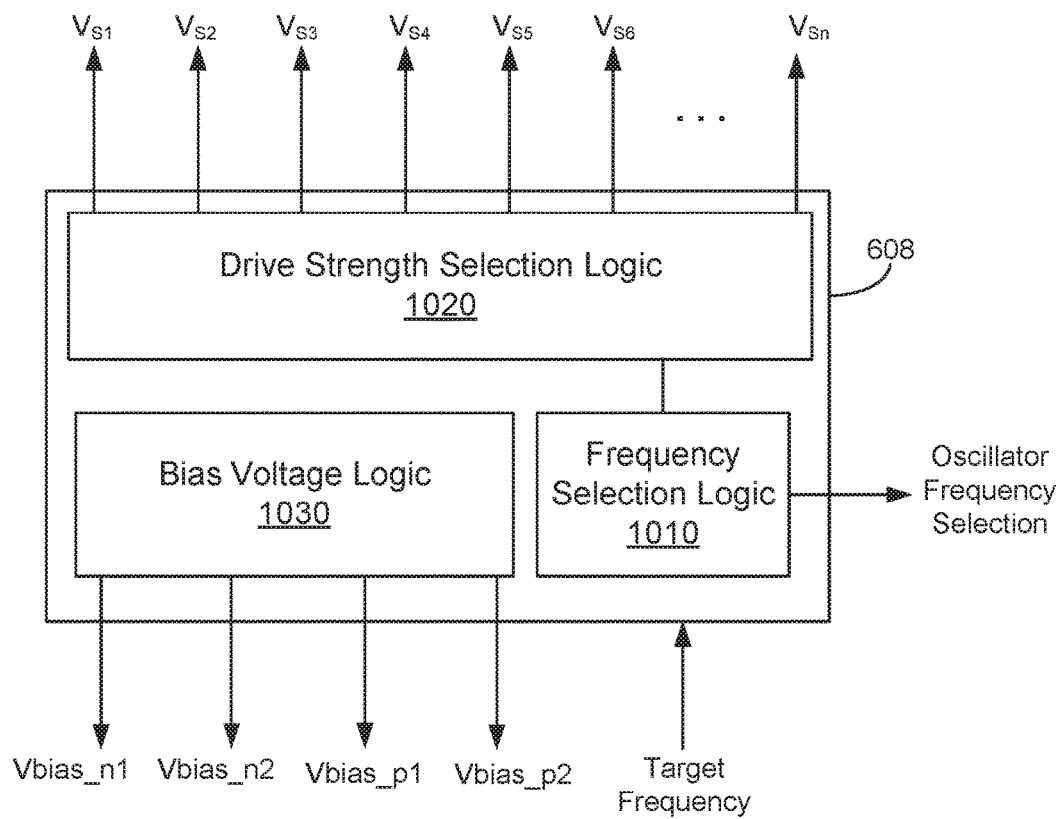
FIG. 10 depicts one embodiment of a controller.

FIG. 10 depicts one embodiment of controller 608. The controller 608 has frequency selection logic 1010, drive strength selection logic 1020, and bias voltage logic 1030, in one embodiment. The controller 608 of FIG. 10 could be used to implement the controller in FIG. 6A. However, the controller 608 of FIG. 6 is not required to have all of the elements of the controller 608 of FIG. 10. In one embodiment, the controller 608 of FIG. 6 does not have the bias voltage logic 1030.

The frequency selection logic 1010 is configured to issue an oscillator frequency selection signal to the frequency synthesizer 602. In one embodiment, the oscillator frequency selection signal is input to a PLL in the frequency synthesizer 602 in order to control the frequency of the oscillator signal (LO_in). In one embodiment, oscillator frequency selection signal is used to control a programmable counter in the frequency synthesizer 602.

In one embodiment, the controller 608 receives one or more inputs that instructs the controller 608 as to the desired frequency for the oscillator signal (LO_in). FIG. 10 depicts a "target frequency" signal input to the controller 608. The target frequency signal may be a digital or analog signal that indicates a target frequency for the oscillator signal (LO_in). For example, the electronic device (e.g., cellular telephone) that contains the oscillator 631 may have logic that determines a target oscillator signal frequency that the oscillator 631 should generate. This may be based on considerations such as the frequencies at which a cellular network is permitted to operate. This logic may inform the controller 608 what frequency is to be generated. In one embodiment, the controller 608 contains such logic that determines the target frequency, and hence is not required that the controller 608 receive a target frequency signal informing the controller 608 of the desired frequency.

The drive strength selection logic 1020 is configured to issue signals to control switches in the programmable driver 604. The control signals are referred to as Vs1, Vs2, Vs3, Vs4, Vs5, Vs6, . . . Vsn, in FIG. 10. These are voltages that are used to control switches in the programmable driver 604, in one embodiment. Each switch in the programmable driver 604 may include one or more transistors. At least one of the transistors has a control terminal that is used to open or close the switch, in one embodiment. The control terminal is a gate of an FET, in one embodiment. The control terminal is a base of a BJT, in one embodiment. Thus, the set of voltages may be applied to control terminals of the transistors to close or open or the switches. Therefore, the stages 704 may be enabled/disabled. The drive strength selection logic 1020 may generate the control terminal voltages for switches 818-832 (see FIG. 8A); 840, 850, 860, 870 (see FIG. 8B); 892, 894, 896, 898 (see FIG. 8C). The number of control signals may vary depending on the number of switches. The drive strength selection logic 1020 is connected to the frequency selection logic 1010, which allows the drive strength selection logic 1020 to generate the control signals based on the frequency of the oscillator signal (LO_in), in one embodiment.

The bias voltage logic 1030 is configured to send bias voltages (e.g., Vbias_n1, Vbias_n2, Vbias_p1, Vbias_p2 in FIG. 9) to the frequency mixer 610. The bias voltages may be applied in the frequency mixer 610. For example, the bias voltages may be applied to gates of transistors in the frequency mixer 610. The bias voltages are used to create a counter second order non-linearity in the frequency mixer 610, in one embodiment. The counter second order non-linearity may be used to counter even (e.g., second) order non-linearity due at least in part to component mis-matches in the frequency mixer 610. In one embodiment, the bias voltages are applied in the frequency mixer 610 to counter an even order (e.g., second order) non-linearity in the frequency mixer while the controller 608 controls the drive strength of the programmable driver 604.

The frequency selection logic 1010, drive strength selection logic 1020, and/or bias voltage logic 1030 may be implemented using hardware, software, or a combination of both hardware and software. For example, frequency selection logic 1010, drive strength selection logic 1020, and bias voltage logic 1030 may be implemented with a Field-programmable Gate Array (FPGA), Application-specific Integrated Circuit (ASIC), Application-specific Standard Product (ASSP), System-on-a-chip system (SOC), Complex Programmable Logic Device (CPLD), special purpose computer, etc. In one embodiment, software (stored on a storage device) is used to program one or more processors to implement functions performed by the frequency selection logic 1010, drive strength selection logic 1020, and/or bias voltage logic 1030.

Figure 11:
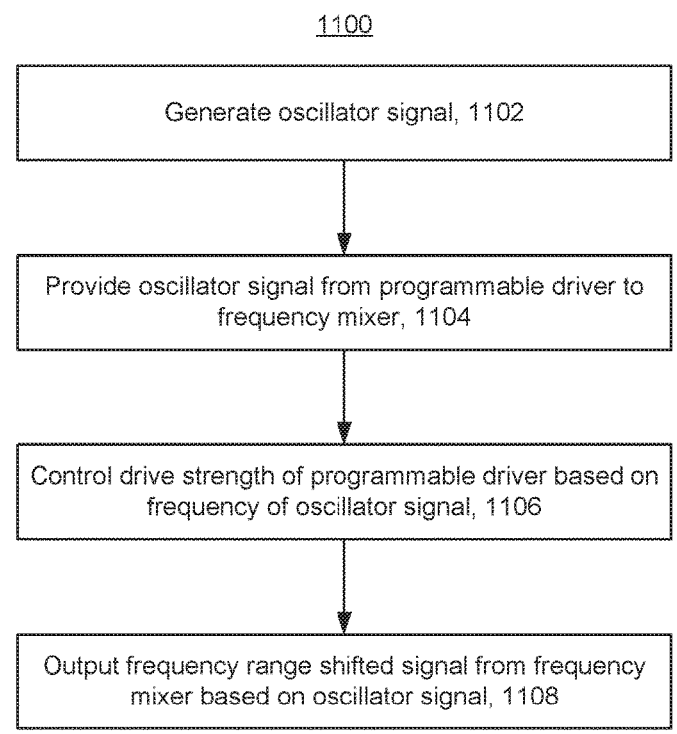
FIG. 11 is a flowchart of one embodiment of a process of shifting a frequency range of a signal.

FIG. 11 is a flowchart of one embodiment of a process 1100 of shifting a frequency range of a signal. The process 1100 is performed by the circuit 600 for shifting a frequency range of a signal, in one embodiment. The process 1100 is performed in a radio receiver, in one embodiment. Process 1100 may be performed by radio receiver 204 or 304, but is not limited to those radio receivers. Process 1100 may be performed by a direct conversion receiver (e.g., DCR 404), or a superheterordyne receiver, but is not limited thereto. The process 1100 is performed in a radio transmitter, in one embodiment. Process 1100 may be performed by radio transmitter 202 or 302, but is not limited to those radio transmitters. Process 1100 may be performed by a direct conversion transmitter (e.g., transmitter 502), or a superheterordyne transmitter, but is not limited thereto.

Step 1102 includes generating an oscillator signal. The oscillator signal is generated by frequency synthesizer 602, in one embodiment. In one embodiment, the oscillator signal is generated by an oscillator (e.g., oscillator 631) having a programmable driver 604. The programmable driver 604 is configured to have a variable drive strength, in one embodiment. In one embodiment, step 1102 includes the frequency selection logic 1010 of the controller 608 issuing a control signal to the frequency synthesizer 602 in order to control the frequency of the oscillator signal (LO_in).

Step 1104 includes providing the oscillator signal from the programmable driver 604 to a frequency mixer 610. In one embodiment, the oscillator signal is provided to an oscillator input of the frequency mixer 610. The frequency mixer 610 is also provided with an input signal. The input signal (V_sigi) is a radio frequency signal, in one embodiment. The input signal (V_sigi) is a baseband signal, in one embodiment. The input signal (V_sigi) is an intermediate frequency signal, in one embodiment.

Step 1106 includes controlling the drive strength of the programmable driver 604 based on a frequency of the oscillator signal. Step 1106 includes controlling the drive strength of the programmable driver 604 based on a frequency of the oscillator signal in order to adjust a rise time and a fall time of the oscillator signal at the oscillator input of the frequency mixer 610, in one embodiment. In one embodiment, controller 608 issues control signals to control the programmable driver 604. The control signals are used to open and close switches to disable/enable stages 704 of the programmable driver 604, in one embodiment. In one embodiment, step 1106 includes the drive strength logic 1020 of the controller 608 issuing control signals (e.g., voltages) to control terminals (e.g., gates) of transistors in the programmable driver 604 in order to control the drive strength of the programmable driver 604.

In one embodiment, step 1106 includes controlling the programmable driver to have a lower driver strength at lower oscillator signal frequencies and a higher drive strength at higher oscillator signal frequencies. For example, a first drive strength may be used at a first oscillator signal frequency and a second drive strength may be used at a second oscillator signal frequency. In this example, the first drive strength is less than the second drive strength, and the first oscillator signal frequency is lower than the second oscillator signal frequency. This may result in the rise and fall times for the oscillator signal at the oscillator input of the frequency mixer 610 being slower at the first (lower) oscillator signal frequency relative to the second (higher) oscillator signal frequency. Therefore, good gain and linearity in the frequency mixer 610 is achieved at both the first (lower) and second (higher) oscillator signal frequencies.

In some cases, a wide frequency range (e.g., 600 MHz to 6000 MHz) may need to be covered. Also, the programmable driver might have only two states, wherein a lower drive strength may be applied for a lower half of the frequency range and a higher drive strength may be applied for a higher half of the frequency range.

Step 1108 includes outputting a frequency range shifted signal from the frequency mixer based on the oscillator signal. Step 1108 includes down-converting a radio frequency signal, in one embodiment, the radio frequency signal is down-converted to a baseband signal. The radio frequency signal is down-converted to an intermediate frequency signal, in one embodiment. Step 1108 includes up-converting the input signal (V_sigi), in one embodiment. The input signal (V_sigi) is a baseband signal, which is up-converted to a radio frequency signal, in one embodiment. The input signal (V_sigi) is an intermediate frequency signal, which is up-converted to a radio frequency signal, in one embodiment. In one embodiment, step 1108 includes modulating a carrier wave (e.g., oscillator signal) with the input signal (V_sigi).

Figure 12:
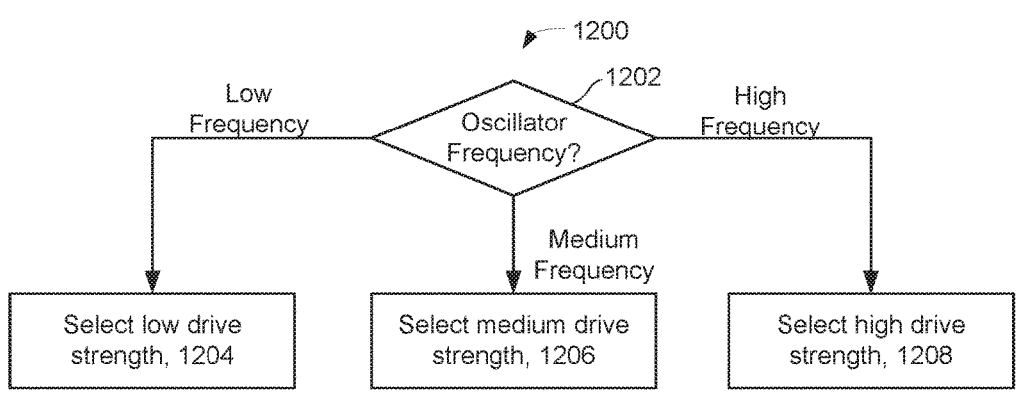
FIG. 12 is a flowchart of one embodiment of a process of selecting a drive strength of a programmable driver, based on a frequency of an oscillator signal.

FIG. 12 is a flowchart of one embodiment of a process 1200 of selecting a drive strength of a programmable driver 604, based on a frequency of an oscillator signal. The process 1200 is used in one embodiment of step 1106 of process 1100. The process 1200 is performed by controller 608, in one embodiment. For the sake of illustration, the process 1200 discusses a low, medium and high drive strength. The terms "low drive strength," "medium drive strength," and "high drive strength," are used relative to each other. Thus, "medium drive strength" means more strength than the "low drive strength" but less strength than the "high drive strength."

Step 1202 is a determination of the oscillator signal frequency. The controller 608 makes this determination, in one embodiment. Step 1202 does not require that the precise frequency of the oscillator signal frequency be determined. Rather it is sufficient to determine whether the oscillator signal frequency is low, medium, or high, in one embodiment.

A wide variety of techniques may be used to determine the oscillator signal frequency. In one embodiment, the electronic device (e.g., cellular telephone) that contains the oscillator 631 has logic that determines an oscillator signal frequency that the oscillator 631 should generate. This may be based on considerations such as the frequencies at which a cellular network is permitted to operate. This logic may inform the controller 608 what frequency is to be generated. For example, a "target frequency" signal may be provided to the controller 608, as depicted in FIG. 10. In one embodiment, the controller 608 contains such logic that determines the target frequency.

The oscillator signal frequency may be determined in another manner. For example, with reference to FIG. 10, the frequency selection logic 1010 may provide a signal to the drive strength selection logic 1020, which at least indicates whether the oscillator signal frequency is low, medium, or high. As one example, the frequency selection logic 1010 may provide the oscillator frequency selection signal to the drive strength selection logic 1020. Recall that the oscillator frequency selection signal may be a signal that controls a programmable counter in the frequency synthesizer. Thus, in this example, a low oscillator signal frequency may be indicated by the signal to the programmable counter being below (or above) a first value, a high oscillator signal frequency may be indicated by the signal to the programmable counter being above (or below) a second value.

The process 1200 takes one of three branches, based on whether the oscillator signal frequency is below a first frequency (low frequency), above a second frequency (high frequency), or between the first and second frequencies (medium frequency). For a cellular telephone embodiment, an example of the first frequency is about 1 GHz, and an example of the second frequency is about 3 GHz. These are just examples, wherein it will be understood that other choices can be made for the low and high frequencies.

In response to determining that the oscillator signal frequency is below the first frequency, the controller 608 selects a low drive strength, in step 1204. The controller 608 issues a control signal to the programmable driver 604 to enable/disable stages 704 to achieve the low drive strength, in one embodiment. With respect to the programmable driver 604 of FIG. 8A, the controller 608 might enable one stage 704 and disable three stages, by appropriate selection of switches 818-832.

Having the low drive strength may result in slower rise and fall times of the oscillator signal at the oscillator signal input of the frequency mixer 610 (relative to the medium and high drive strength cases). The slower rise and fall times may help to introduce a counter second order non-linearity, which counters a second order non-linearity that is due at least in part to component mis-matches in the frequency mixer 610. Thus, second order non-linearities in the frequency mixer 610 may be reduced or eliminated at or below the low frequency.

In response to determining that the oscillator signal frequency is above the second frequency, the controller 608 selects a high drive strength, in step 1208. The controller 608 issues a control signal the programmable driver 604 to enable/disable stages 704 to achieve the high drive strength, in one embodiment. With respect to the programmable driver 604 of FIG. 8A, the controller 608 might enable all four stages 704, by appropriate selection of switches 818-832.

Having the high drive strength may result is faster rise and fall times of the oscillator signal at the oscillator signal input of the frequency mixer 610 (relative to the medium and low drive strength cases). A faster rise and fall time, at higher oscillator signal frequencies, can provide good gain while still providing the ability to improve linearity of the frequency mixer 610 at or above the high frequency.

In response to determining that the oscillator signal frequency is between the first and second frequencies, the controller 608 selects a medium drive strength, in step 1206. The controller 608 issues a control signal the programmable driver 604 to enable/disable stages 704 to achieve the medium drive strength, in one embodiment. With respect to the programmable driver 604 of FIG. 8A, the controller 608 might enable two or three stages 704 and disable the remaining stages, by appropriate selection of switches 818-832. The medium oscillator signal frequency range might be further divided into a medium-low frequency range, and a medium-high frequency range. The drive strength may be selected, based on the oscillator signal frequency, to achieve a target rise and fall time of the oscillator signal at the oscillator signal input of the frequency mixer 610 to reduce or eliminate non-linear distortion.

Process 1200 describes selecting one of three drive strengths based on which of three frequency ranges that the oscillator signal falls into. The concept can be applied to fewer or more than three drive strengths (and their corresponding frequency ranges). In one embodiment, just two different drive strengths are used for two frequency ranges. However, there could be four, five, or many more frequency ranges, each with a corresponding drive strength for the programmable driver 604.

Figure 13:
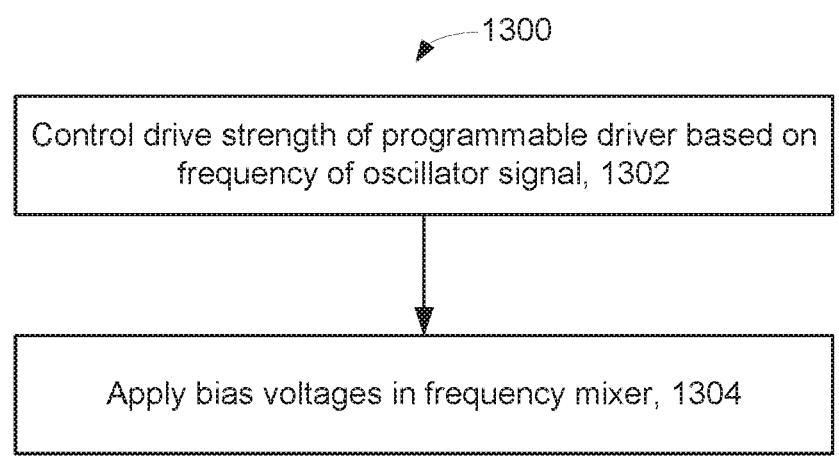
FIG. 13 is a flowchart of one embodiment of a process for controlling non-linearity in a frequency mixer.

FIG. 13 is a flowchart of one embodiment of a process 1300 for controlling non-linearity in a frequency mixer 610. The process 1300 is used to control even order non-linearities in a frequency mixer 610, including second order non-linearity. Process 1300 may result in good linearity for a frequency mixer 610 over a wide frequency range.

Step 1302 includes controlling a drive strength of a programmable driver 604 based on a frequency of an oscillator signal. Step 1302 may be similar to step 1106 of FIG. 11.

Step 1304 includes applying bias voltages in the frequency mixer 610. In one embodiment, step 1304 includes creating counter second order non-linearity. The counter second order non-linearity may be used to counter a second order non-linearity due to component mis-matches in the frequency mixer 610. In one embodiment, step 1304 includes selecting bias voltages to create the counter second order non-linearity.

The bias voltage logic 1030 in the controller 608 issues Vbias_n1 to bias resistor 912 and Vbias_n2 to bias resistor 916, in one embodiment. In one embodiment, the magnitude of Vbias_n1 is equal to the magnitude of Vbias_n2. However, it is not required that the magnitude of Vbias_n1 be equal to the magnitude of Vbias_n2. The bias voltage logic 1030 in the controller 608 applies Vbias_p1 to bias resistor 918 and Vbias_p2 to bias resistor 914, in one embodiment. In one embodiment, the magnitude of Vbias_p1 is equal to the magnitude of Vbias_p2. However, it is not required that the magnitude of Vbias_p1 be equal to the magnitude of Vbias_p2. A first offset between Vbias_p1 and Vbias_n1 and a second offset between Vbias_p2 and Vbias_n2 are used to create counter second order non-linearity that may be used to counter a second order non-linearity due to component mis-matches in the frequency mixer 610. The first and second offsets are equal in magnitude and polarity, in one embodiment. Vbias_p1 may be greater than or less than Vbias_n1. Likewise, Vbias_p2 may be greater than or less than Vbias_n2.

The first and second offsets may be different at different oscillator signal frequencies. In one embodiment, the first and second offsets are greater at lower oscillator signal frequencies. The greater offset at lower oscillator signal frequencies can help to create more counter second order non-linearity. This can be beneficial if there is more second order non-linearity due to, for example, component mis-matches at lower oscillator signal frequencies. For at least some frequency mixers, there may be more second order non-linearity due to, for example, component mis-matches at lower oscillator signal frequencies.

On the other hand, for at least some frequency mixers, there may be less second order non-linearity due to, for example, component mis-matches at higher oscillator signal frequencies. Thus, less offset might be used at higher oscillator signal frequencies (relative to the offset at lower oscillator signal frequencies). However, the frequency mixer 610 still has good linearity at the higher oscillator signal frequencies. A factor in the good linearity at the higher oscillator signal frequencies may be the higher drive strength of the programmable driver 604 at higher oscillator signal frequencies.

The technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

For purposes of this document, each process associated with the disclosed technology may be performed continuously and by one or more computing devices. Each step in a process may be performed by the same or different computing devices as those used in other steps, and each step need not necessarily be performed by a single computing device.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A circuit for shifting a frequency range of a signal, comprising:
    a frequency mixer having a signal input, an oscillator input, and a signal output;
    a frequency synthesizer configured to generate an oscillator signal having a frequency;
    a programmable driver configured to receive the oscillator signal from the frequency synthesizer and to provide the oscillator signal to the oscillator input of the frequency mixer, the programmable driver configured to have a variable drive strength; and
    a controller configured to control the drive strength of the programmable driver based on the frequency of the oscillator signal to adjust a rise time and a fall time of the oscillator signal at the oscillator input of the frequency mixer,
    wherein the frequency mixer is configured to output, at the signal output of the frequency mixer, a frequency range shifted version of a signal received at the signal input of the frequency mixer based on the frequency of the oscillator signal.

2. The circuit of claim 1, wherein the controller is further configured to:
    control, in response to the frequency of the oscillator signal being a first frequency, the drive strength of the programmable driver to have a first drive strength to cause the rise time of the oscillator signal at the oscillator input to have a first rise time and the fall time of the oscillator signal at the oscillator input to have a first fall time; and
    control, in response to the frequency of the oscillator signal being a second frequency, the drive strength of the programmable driver to have a second drive strength to cause the rise time of the oscillator signal at the oscillator input to have a second rise time and the rise time of the oscillator signal at the oscillator input to have a second fall time, wherein the first drive strength is less than the second drive strength, the first frequency is lower than the second frequency, the first rise time is longer than the second first rise time, and the first fall time is longer than the second fall time.

3. The circuit of claim 1, wherein:
    the programmable driver comprises a plurality of stages; and
    the controller is configured to select one or more of the stages based on the frequency of the oscillator signal to select the drive strength of the programmable driver.

4. The circuit of claim 3, wherein:
    each of the stages comprises one or more inverters; and
    the controller is configured to switch each inverter on or off based on the frequency of the oscillator signal to select the drive strength of the programmable driver.

5. The circuit of claim 3, wherein each of the plurality of stages has an input coupled to the frequency synthesizer to receive the oscillator signal, and wherein each of the plurality of stages has an output coupled to the oscillator input of the frequency mixer.

6. The circuit of claim 1, further comprising:
    circuitry configured to apply bias voltages in the frequency mixer to counter an even order non-linearity in the frequency mixer while the controller controls the drive strength of the programmable driver.

7. The circuit of claim 1, wherein the frequency mixer comprises a first transistor having a first control terminal, a second transistor having a second control terminal, a third transistor having a third control terminal, a fourth transistor having a fourth control terminal, a first bias resistor coupled to the first control terminal, a second bias resistor coupled to the second control terminal, a third bias resistor coupled to the third control terminal, and a fourth bias resistor coupled to the fourth control terminal, wherein the oscillator signal comprises an in-phase signal and an out-of-phase signal, the in-phase signal is provided to the first control terminal and the second control terminal, the out-of-phase signal is provided to the third control terminal and the fourth control terminal, wherein the controller is configured to control a first voltage offset between a first bias voltage applied to the first bias resistor and a second bias voltage applied to the second bias resistor and to control a second voltage offset between a third bias voltage applied to the third bias resistor and a fourth bias voltage applied to the fourth bias resistor to counter a non-linearity in the frequency mixer.

8. The circuit of claim 1, wherein the circuit resides in a direct conversion receiver.

9. The circuit of claim 1, wherein the frequency mixer is a down-mixer.

10. A method of shifting a frequency range of a signal, the method comprising:
  generating an oscillator signal by a frequency synthesizer, the oscillator signal having a frequency;
  providing the oscillator signal from a programmable driver to an oscillator input of a frequency mixer, the programmable driver configured to have a variable drive strength;
  controlling the drive strength of the programmable driver based on the frequency of the oscillator signal in order to adjust a rise time and a fall time of the oscillator signal at the oscillator input of the frequency mixer; and
  outputting a frequency range shifted version of a signal received at a signal input of the frequency mixer at a signal output of the frequency mixer based on the frequency of the oscillator signal.

11. The method of claim 10, wherein controlling the drive strength of the programmable driver based on the frequency of the oscillator signal in order to adjust the rise time and the fall time of the oscillator signal at the oscillator input of the frequency mixer comprises:
  controlling, in response to the frequency of the oscillator signal being a first frequency, the drive strength of the programmable driver to have a first drive strength to cause the rise time of the oscillator signal at the oscillator input to have a first rise time and the fall time of the oscillator signal at the oscillator input to have a first fall time; and
  controlling, in response to the frequency of the oscillator signal being a second frequency, the drive strength of the programmable driver to have a second drive strength to cause the rise time of the oscillator signal at the oscillator input to have a second rise time and the rise time of the oscillator signal at the oscillator input to have a second fall time, wherein the first drive strength is less than the second drive strength, the first frequency is lower than the second frequency, the first rise time is longer than the second first rise time, and the first fall time is longer than the second fall time.

12. The method of claim 10, wherein controlling the drive strength of the programmable driver comprises:
  selecting one or more stages in the programmable driver based on the frequency of the oscillator signal.

13. The method of claim 12, wherein selecting one or more stages comprises:
  switching one or more inverters in each of the stages on or off.

14. The method of claim 10, further comprising:
  applying bias voltages in the frequency mixer to counter a second order non-linearity in the frequency mixer while controlling the drive strength of the programmable driver based on the frequency of the oscillator signal.

15. The method of claim 10, wherein providing the oscillator signal from the programmable driver to the oscillator input of the frequency mixer comprises providing an in-phase oscillator signal to a first control terminal of a first transistor in the frequency mixer and a second control terminal of a second transistor in the frequency mixer and providing an out-of-phase oscillator signal to a third control terminal of a third transistor in the frequency mixer and a fourth control terminal of a fourth transistor in the frequency mixer, the first control terminal coupled to a first bias resistor in the frequency mixer, the second control terminal coupled to a second bias resistor in the frequency mixer, the third control terminal coupled to a third bias resistor in the frequency mixer, the fourth control terminal coupled to a fourth bias resistor in the frequency mixer, and further comprising:
  adjusting a first bias voltage applied to the first bias resistor, a second bias voltage applied to the second bias resistor, a third bias voltage applied to the third bias resistor, a fourth bias voltage applied to the fourth bias resistor to counter an even order non-linearity in the frequency mixer.

16. A radio frequency (RF) signal receiver, comprising:
  a frequency mixer having an oscillator signal input, an RF signal input, and a baseband signal output;
  an amplifier coupled to the RF signal input and configured to provide an RF signal to the frequency mixer;
  a local oscillator having a frequency synthesizer and a programmable driver coupled to the frequency synthesizer, the frequency synthesizer configured to provide an oscillator signal having a frequency to the programmable driver, the programmable driver coupled to the oscillator signal input of the frequency mixer to provide the oscillator signal to the oscillator signal input of the frequency mixer, the programmable driver configured to have a programmable drive strength to adjust a rise time and a fall time of the oscillator signal at the oscillator signal input of the frequency mixer; and
  a controller configured to control the drive strength of the programmable driver based on the frequency of the oscillator signal to adjust the rise time and the fall time of the oscillator signal at the oscillator signal input of the frequency mixer,
  the frequency mixer configured to output a baseband signal at the baseband signal output based on the RF signal and the oscillator signal.

17. The RF signal receiver of claim 16, wherein the controller is further configured to increase the drive strength of the programmable driver in response to the frequency of the oscillator signal increasing and to decrease the drive strength of the programmable driver in response to the frequency of the oscillator signal decreasing.

18. The RF signal receiver of claim 16, wherein:
  the programmable driver comprises a plurality of stages, each of the stages having an input connected to the frequency synthesizer to receive the oscillator signal, each of the stages having an output connected to the oscillator signal input of the frequency mixer; and
  the controller is further configured to select one or more of the stages of the programmable driver to thereby control the drive strength of the programmable driver based on the frequency of the oscillator signal.

19. The RF signal receiver of claim 18, wherein each of the plurality of stages comprises:
a first switch connected to a first voltage terminal;
a second switch connected to a second voltage terminal; and
an inverter connected between the first switch and the second switch.

20. The RF signal receiver of claim 19, wherein the controller is further configured to:
turn on both the first switch and the second switch in a particular stage to enable the particular stage; and
turn off both the first switch and the second switch in the particular stage to disable the particular stage.

* * * * *